US009385061B2

(12) United States Patent
Nakamura et al.

(10) Patent No.: US 9,385,061 B2
(45) Date of Patent: Jul. 5, 2016

(54) SEMICONDUCTOR DEVICE AND METHOD FOR MANUFACTURING SEMICONDUCTOR DEVICE

(71) Applicant: FUJI ELECTRIC CO., LTD., Kawasaki-shi (JP)

(72) Inventors: Hideyo Nakamura, Matsumoto (JP); Masafumi Horio, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/455,129

(22) Filed: Aug. 8, 2014

(65) Prior Publication Data

US 2014/0346659 A1    Nov. 27, 2014

Related U.S. Application Data

(63) Continuation of application No. PCT/JP2013/001804, filed on Mar. 15, 2013.

(30) Foreign Application Priority Data

Mar. 28, 2012 (JP) ................................. 2012-072673
Aug. 21, 2012 (JP) ................................. 2012-182614

(51) Int. Cl.
*H01L 23/04* (2006.01)
*H01L 23/36* (2006.01)
(Continued)

(52) U.S. Cl.
CPC .............. *H01L 23/36* (2013.01); *H01L 23/043* (2013.01); *H01L 23/08* (2013.01);
(Continued)

(58) Field of Classification Search
CPC .. H01L 23/041; H01L 23/544; H01L 25/0655

USPC ......................................................... 257/704
See application file for complete search history.

(56) References Cited

U.S. PATENT DOCUMENTS 4,729,744 A    3/1988  Bet et al.
5,202,578 A    4/1993  Hideshima
(Continued)

FOREIGN PATENT DOCUMENTS

EP    2284889 A1    2/2011
JP    62-86900 A    4/1987
(Continued)

OTHER PUBLICATIONS

International Search Report for PCT/JP2013/001804, mail date May 21, 2013.
(Continued)

*Primary Examiner* — Christine Enad
(74) *Attorney, Agent, or Firm* — Rossi, Kimms & McDowell LLP

(57) ABSTRACT

A semiconductor device includes: semiconductor modules in which a circuit board having at least one or more semiconductor chips mounted thereon is sealed with a mold resin material and an attachment hole is formed; main terminal plates that individually connect individual connection terminals of the plurality of semiconductor modules which are arranged in parallel; and a module storage case into which the plurality of the semiconductor modules connected by the main terminal plates are inserted integrally with the main terminal plates from an opening portion and which holds the plurality of semiconductor modules such that the position of the semiconductor modules can be adjusted during attachment and includes attachment insertion holes facing the attachment holes of the semiconductor modules.

15 Claims, 16 Drawing Sheets

(51) Int. Cl.

| | | |
|---|---|---|
| *H02M 7/00* | (2006.01) | |
| *H01L 25/07* | (2006.01) | |
| *H05K 7/14* | (2006.01) | |
| *H05K 7/20* | (2006.01) | |
| *H01L 23/043* | (2006.01) | |
| *H01L 23/373* | (2006.01) | |
| *H01L 23/433* | (2006.01) | |
| *H01L 23/08* | (2006.01) | |
| *H01L 25/065* | (2006.01) | |
| *H01L 23/40* | (2006.01) | |
| *H01L 25/11* | (2006.01) | |
| *H01L 25/18* | (2006.01) | |
| *H01L 23/538* | (2006.01) | |

(52) U.S. Cl.
CPC ....... *H01L 23/3735* (2013.01); *H01L 23/4006* (2013.01); *H01L 23/4334* (2013.01); *H01L 25/0655* (2013.01); *H01L 25/072* (2013.01); *H01L 25/115* (2013.01); *H02M 7/003* (2013.01); *H05K 7/1432* (2013.01); *H05K 7/209* (2013.01); *H01L 23/5385* (2013.01); *H01L 25/18* (2013.01); *H01L 2224/16225* (2013.01); *H01L 2924/10253* (2013.01); *H01L 2924/10272* (2013.01); *H01L 2924/13055* (2013.01); *H01L 2924/1421* (2013.01)

(56) References Cited

U.S. PATENT DOCUMENTS

| | | | | |
|---|---|---|---|---|
| 5,408,128 | A | | 4/1995 | Furnival |
| 5,927,504 | A | * | 7/1999 | Han et al. .................. 206/706 |
| 8,526,199 | B2 | | 9/2013 | Matsumoto et al. |
| 2004/0248330 | A1 | | 12/2004 | Kitabatake et al. |
| 2005/0093137 | A1 | | 5/2005 | Ishikawa et al. |
| 2007/0183130 | A1 | | 8/2007 | Yamabuchi et al. |
| 2007/0242584 | A1 | | 10/2007 | Chan |
| 2008/0284007 | A1 | * | 11/2008 | Horio et al. .................. 257/734 |
| 2008/0290506 | A1 | | 11/2008 | Aoki et al. |
| 2010/0039843 | A1 | | 2/2010 | Takizawa |
| 2010/0127371 | A1 | * | 5/2010 | Tschirbs .................. 257/684 |
| 2010/0128441 | A1 | | 5/2010 | Soda et al. |
| 2010/0149774 | A1 | * | 6/2010 | Matsumoto et al. .......... 361/783 |
| 2011/0203967 | A1 | | 8/2011 | Starovecky |
| 2011/0273861 | A1 | | 11/2011 | Matsumoto et al. |
| 2012/0008286 | A1 | | 1/2012 | Suzuki |
| 2012/0241953 | A1 | | 9/2012 | Yamada et al. |
| 2012/0256194 | A1 | | 10/2012 | Yoshihara et al. |
| 2013/0062751 | A1 | | 3/2013 | Takagi et al. |
| 2013/0154081 | A1 | | 6/2013 | Kadoguchi et al. |
| 2014/0210067 | A1 | | 7/2014 | Takamiya et al. |

FOREIGN PATENT DOCUMENTS

| | | | |
|---|---|---|---|
| JP | 04133391 | A | 5/1992 |
| JP | 05-094854 | A | 4/1993 |
| JP | 05218252 | A | 8/1993 |
| JP | 06013539 | A | 1/1994 |
| JP | 07123738 | A | 5/1995 |
| JP | 07-240497 | A | 9/1995 |
| JP | 10093016 | A | 4/1998 |
| JP | 3430192 | B2 | 5/1998 |
| JP | 2001036005 | A | 2/2001 |
| JP | 2003289130 | A | 10/2003 |
| JP | 2004289103 | A | 10/2004 |
| JP | 2005065414 | A | 3/2005 |
| JP | 2006081308 | A | 3/2006 |
| JP | 2006081312 | A | 3/2006 |
| JP | 2006332291 | A | 12/2006 |
| JP | 2007194442 | A | 8/2007 |
| JP | 4129027 | B2 | 12/2007 |
| JP | 2008193779 | A | 8/2008 |
| JP | 2008294069 | A | 12/2008 |
| JP | 2010103222 | A | 5/2010 |
| JP | 2010103343 | A | 5/2010 |
| JP | 2010245096 | A | 10/2010 |
| JP | 2010251772 | A | 11/2010 |
| JP | 2011233606 | A | 11/2011 |
| WO | 2008142758 | A1 | 11/2008 |
| WO | 2011/083737 | A1 | 7/2011 |
| WO | 2012029164 | A1 | 3/2012 |

OTHER PUBLICATIONS

Office Action issued in JP2014-507624, mailed Dec. 1, 2015. English translation provided.
Extended European Search Report issued in EP137703542, mailed Dec. 16, 2015.
Extended European Search Report issued in EP13769080.6, mailed Dec. 17, 2015.
Extended European Search Report issued in EP13770136.3, mailed Nov. 10, 2015.
International Search Report issued in PCT/JP2013/056634, mailed Jun. 11, 2013.
International Search Report issued in PCT/JP2013/001805, mailed May 21, 2013.
Office Action issued in U.S. Appl. No. 14/455,184, mailed Oct. 19, 2015.
Dffice Action issued in U.S. Appl. No. 14/455,098, mailed Jul. 31, 2015.

* cited by examiner

SEMICONDUCTOR DEVICE AND METHOD FOR MANUFACTURING SEMICONDUCTOR DEVICE

CROSS REFERENCE TO RELATED APPLICATIONS

This application is a continuation of International Application No. PCT/JP2013/001804, filed on Mar. 15, 2013, which is based on and claims priority to Japanese Patent Application No. JP 2012-072673, filed on Mar. 28, 2012 and Japanese Patent Application No. JP 2012-182614, filed on Aug. 21, 2012. The disclosure of the Japanese priority applications and the PCT application in their entirety, including the drawings, claims, and the specification thereof, are incorporated herein by reference.

BACKGROUND

1. Field of the Invention

Embodiments of the present invention relate to a semiconductor device that includes a plurality of semiconductor modules including, for example, a power device and a method for manufacturing a semiconductor device.

2. Discussion of the Background

A power conversion inverter device has been widely used as one of power conversion devices. For example, an electric motor is generally used as a driving source of an electric vehicle, a hybrid vehicle, or the like. An inverter device is generally used to control various types of motors. As the power conversion device, a semiconductor module is used in which a power device, such as an insulated gate bipolar transistor (IGBT) or a free-wheeling diode (FWD), is sealed in a predetermined shape with a mold resin material. A plurality of semiconductor modules are combined to form a power conversion device.

A module-type electric device block has been proposed which includes a mutual coupling means. In the module-type electric device block, when two module-type blocks, such as mold cases which surround an electric device, are arranged and connected to each other, the two mold cases are coupled in a hinged manner. When one of the two cases is pivoted to come into contact with the other case, a protruding end of a tongue-shaped portion which is provided in one case is fitted to the outer surface of the other case to couple the two mold cases (for example, see JP 62-86900 A) ("Patent Document 1").

As another attachment method, an inverter device has been proposed in which six main switching elements, which are modules forming one arm of the inverter device, are prepared, are divided into three sets each having two main switching elements, and the main switching elements in each set are connected by a U-phase main circuit board, a V-phase main circuit board, and a W-phase main circuit board (for example, see JP 3430192 B1) ("Patent Document 2").

As another attachment method, a semiconductor device has been proposed in which three semiconductor modules are mounted on the upper surface of a heat sink, a reinforcing beam is arranged on the upper surface of the semiconductor module, with a leaf spring which traverses each semiconductor module interposed therebetween, and screws are inserted from the upper side of the reinforcing beam to the heat sink through the leaf spring and the semiconductor module to fix the three semiconductor module to the heat sink (for example, see JP 4129027 B1) ("Patent Document 3").

A semiconductor device has been proposed in which three columns of semiconductor device units in which a semiconductor chip is sealed with a resin, each column having two semiconductor device units, are arranged on a cooler; bolt tightening units are provided at both ends of each semiconductor device unit in the row direction; a wiring substrate is arranged on the upper surfaces of each semiconductor device unit and each bolt fastening unit; and bolts are inserted into the cooler through the bolt tightening units from the upper side of the wiring substrate to fix the semiconductor device units to the cooler (for example, see WO 2011/083737 A) ("Patent Document 4").

However, in some cases, in order to respond to various requests, such as current capacity or a circuit structure, a plurality of semiconductor modules are combined with each other and arranged to respond to desired current capacity or circuit structure. For these requests, in the related art disclosed in Patent Document 1, two mold cases having the electric devices are coupled to each other by the mutual coupling means including the hinge portion and the tongue-shaped portion. However, in this case, the electrical connection between the two mold cases is not considered at all and there is an unsolved problem that the device cannot be applied as a power conversion semiconductor device.

In the related art disclosed in Patent Document 2, three main elements for an upper arm and three main elements for a lower arm, which form the inverter device, are individually screwed to the radiation fin, the individual main circuit boards are mounted on the upper surfaces of the corresponding main elements for an upper arm and the corresponding main elements for a lower arm, and the terminal portions are fixed to each other by screws. Therefore, when the inverter device is formed, two screwing processes, that is, a process of screwing the main elements to the radiation fin and a process of screwing the main circuit boards to the upper surfaces of each main element for an upper arm and each main element for a lower arm are required and there is an unsolved problem that it takes a lot of time for the attachment operation.

In the related art disclosed in Patent Document 3, three semiconductor modules, the leaf spring for pressure, and the reinforcing beam are arranged on the heat sink and are fixed to the heat sink by the common bolts. Therefore, the leaf spring for pressure and the reinforcing beam are required to bring a plurality of semiconductor modules into close contact with the heat sink and it is difficult to position the semiconductor modules, the leaf spring for pressure, the reinforcing beam, and the female screws of the heat sink when the bolts are tightened. In addition, since the user needs to perform the attachment operation, there is an unsolved problem that assemblability deteriorates. In addition, when the plurality of semiconductor modules and the heat sink are supplied while being attached to each other, there is an unsolved problem that the versatility of the semiconductor module is reduced and the semiconductor module is used only for a specific use.

In the related art disclosed in Patent Document 4, six semiconductor device units are interposed between the bolt fastening units, the wiring substrate covers the semiconductor device units and the bolt fastening units, with an elastic body interposed therebetween, and the bolts are inserted into the cooler through the bolt fastening units from the upper side of four corners of the wiring substrate to fix the semiconductor device units to the cooler. Therefore, there is an advantage that stress which occurs when the bolts are tightened is applied only to the bolt fastening units and is not applied to the semiconductor device units. However, since the six semiconductor device units are not directly fixed to the cooler, there is an unsolved problem that it is difficult to ensure the reliable contact between the semiconductor device units and the cooler.

Patent Document 1 to Patent Document 4 do not disclose a technique which flexibly responds to current capacity or a circuit structure or a technique which mounts a plurality of semiconductor chips in one semiconductor module in order to improve capacity.

SUMMARY

Embodiments of the invention provide a semiconductor device and a semiconductor device manufacturing method which can ensure the reliable contact between a plurality of semiconductor modules and an attachment body and facilitate an attachment operation.

A first aspect of a semiconductor device according to the invention includes: a plurality of semiconductor modules each of which includes a circuit board having at least one or more semiconductor chips mounted thereon, has an attachment hole formed therein, is formed such that a heat dissipation portion is exposed from one end portion of the attachment hole, and includes a protruding connection terminal; main terminal plates that individually connect individual connection terminals of the plurality of semiconductor modules and form an electrical conduction path which connects semiconductor circuits in the semiconductor module; and a module storage case into which the plurality of semiconductor modules connected by the main terminal plates are inserted integrally with the main terminal plates from an opening portion and which accommodates and holds the plurality of semiconductor modules such that the position of the semiconductor modules can be adjusted during attachment and includes insertion holes through which a portion of each of the main terminal plates is drawn as a main terminal segment to the outside and attachment insertion holes which face the attachment holes of the semiconductor modules. The module storage case includes a module storage region in which the plurality of semiconductor modules are accommodated in parallel and a terminal plate storage region which is connected to the module storage region and accommodates the main terminal plates. The module storage region includes guide protrusions that guide the side surfaces of the semiconductor modules and define individual storage regions for accommodating the plurality of semiconductor modules.

According to a second aspect of the semiconductor device of the invention, the guide protrusion may include, at its leading end, a fitting convex portion that is fitted to a fitting groove formed in the side surface of the semiconductor module.

According to a third aspect of the semiconductor device of the invention, the module storage case may be flexible, and a locking protrusion which is fitted to a locking concave portion formed in the semiconductor module may be formed in the module storage region.

According to a fourth aspect of the semiconductor device of the invention, an insulating partition wall which insulates the main terminal plates may be provided in the terminal plate storage region.

According to a fifth aspect of the semiconductor device of the invention, the module storage case may accommodate the plurality of semiconductor modules, with the heat dissipation portion facing the opening portion. Fixing tools may be inserted into the attachment holes of the semiconductor modules, which face the attachment insertion holes, through the attachment insertion holes, with the heat dissipation portion contacted with a cooler, to fix each of the accommodated plurality of semiconductor modules to the cooler.

According to a sixth aspect of the semiconductor device of the invention, in the module storage case, the attachment insertion hole may be formed in an inner circumferential surface of a cylindrical portion which is fitted to the attachment hole of the semiconductor module to ensure an insulation distance of the fixing tool.

According to a seventh aspect of the semiconductor device of the invention, the main terminal plate may include: a terminal plate body that extends so as to traverse the plurality of semiconductor modules and has a plate surface parallel to the attachment hole; a bending plate portion that is provided on one of end surfaces perpendicular to the longitudinal direction of the terminal plate body and serves as the main terminal segment; and a connection terminal holding portion that is formed at the other end surface so as to protrude therefrom and includes insertion holes into which the connection terminals of the plurality of semiconductor modules are inserted.

According to an eighth aspect of the semiconductor device of the invention, the connection terminal holding portion may include a plurality of connection pieces which are flexible and are formed as protrusions at positions corresponding to the connection terminals of the plurality of semiconductor modules.

According to a ninth aspect of the semiconductor device of the invention, the bending plate portion may protrude from the module storage case and is bent so as to face a nut stored in a nut storage concave portion which is formed in an outer surface of the terminal plate storage region to form the main terminal segment. An insertion hole which faces a female screw of the nut and has a larger inside diameter than that of the female screw may be formed in the bending plate portion.

A first aspect of a method for manufacturing a semiconductor device according to the invention is a method for manufacturing a semiconductor device in which a plurality of semiconductor modules, each of which includes a circuit board having at least one or more semiconductor chips mounted thereon and has an attachment hole, are arranged and held in a module storage case. The method includes: inserting a main connection terminal which protrudes from each semiconductor module into an insertion hole of a connection terminal holding portion formed in a main terminal plate which traverses the semiconductor modules, with the plurality of semiconductor modules arranged in parallel, and fixing the main connection terminal and the connection terminal holding portion to form a module aggregate; accommodating and holding the formed module aggregate in the module storage case such that a bending plate portion of the main terminal plate protrudes toward the outside through an insertion hole of the module storage case and the position of the semiconductor modules can be adjusted during attachment, thereby forming a semiconductor device; and mounting the module storage case on a cooler and inserting fixing tools into the attachment holes of the plurality of semiconductor modules through attachment insertion holes, which are formed in the module storage case so as to face the attachment holes, to fix each of the accommodated plurality of semiconductor modules to the cooler.

According to a second aspect of the method for manufacturing a semiconductor device of the invention, the bending plate portion of the main terminal plate may be bent to cover a nut that is inserted into a nut insertion concave portion formed in an outer surface of a main terminal plate storage region of the module storage case when the semiconductor device is formed or after the semiconductor device is mounted on the cooler.

According to embodiments of the invention, a plurality of semiconductor modules, each having a semiconductor chip provided therein, are accommodated and held in a module storage case, while being connected by main terminal plates, such that the position of the semiconductor modules can be adjusted during attachment. Therefore, it is possible to treat the plurality of semiconductor modules as one semiconductor module. It is possible to reliably contact each semiconductor module with, for example, a cooler which is an attachment body.

DESCRIPTION OF ILLUSTRATED EMBODIMENTS

Figure 1:
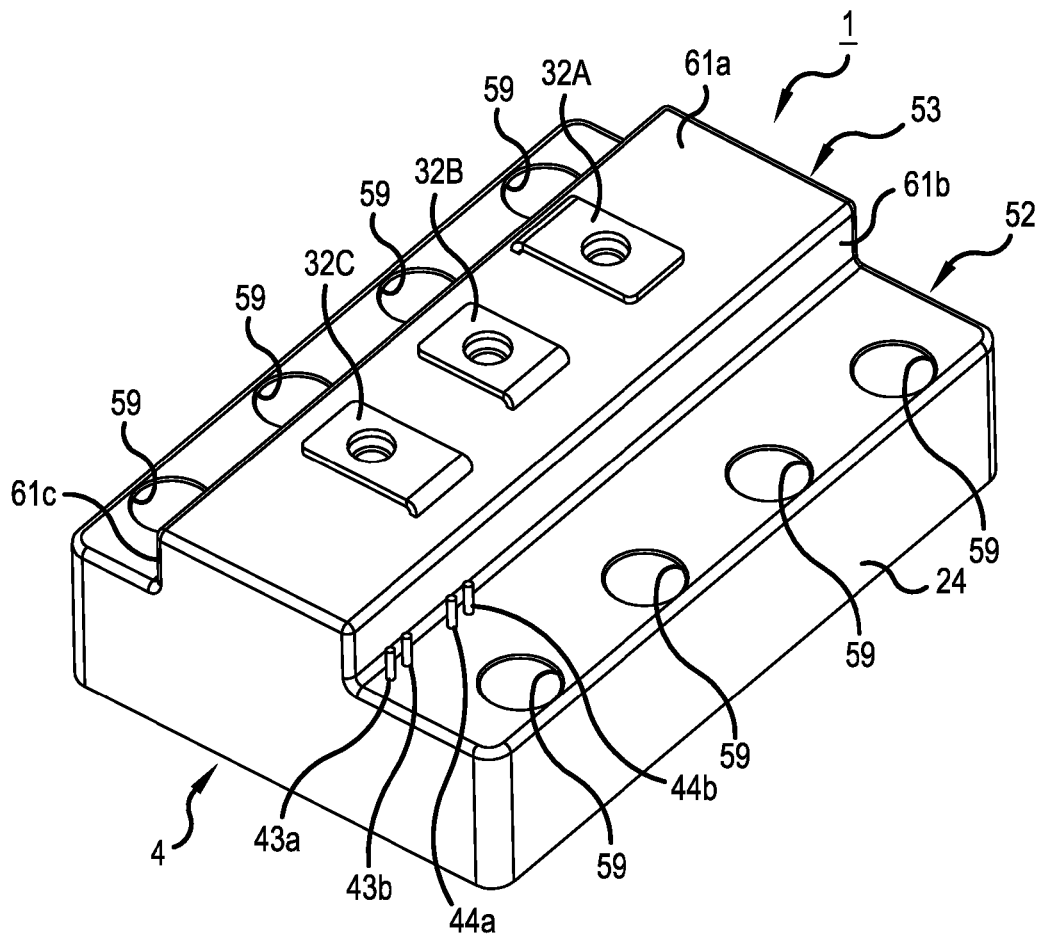
FIG. 1 a perspective view illustrating the top side of a semiconductor device according to a first embodiment of the invention.
Figure 2:
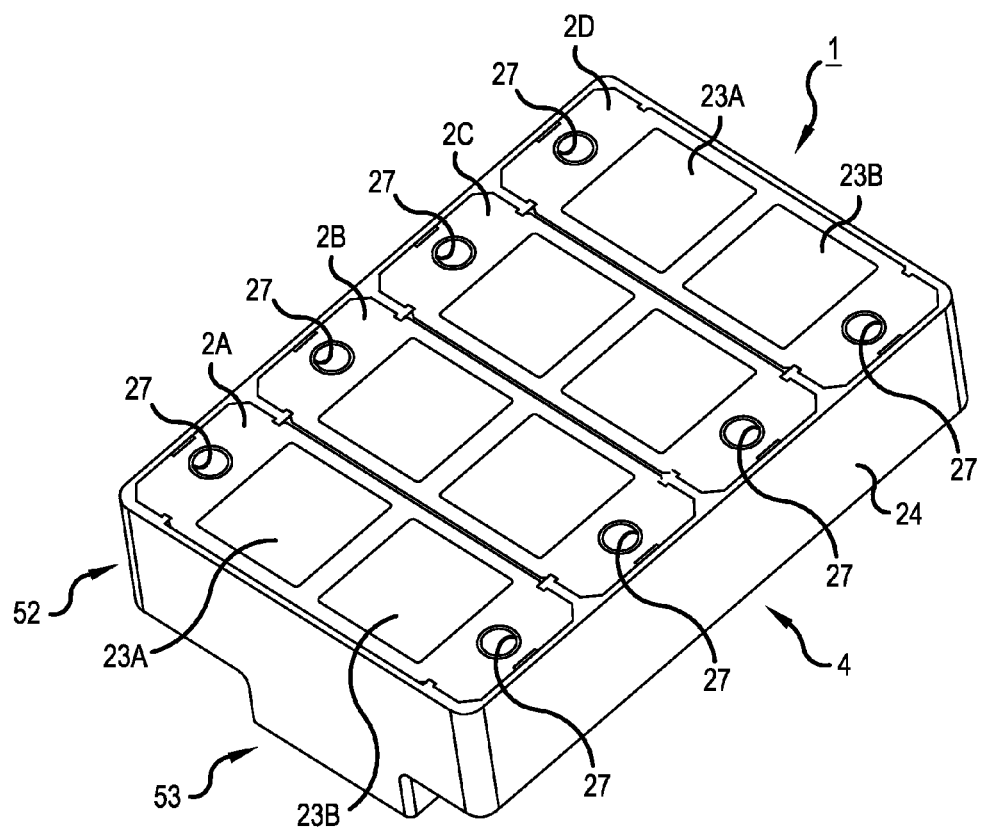
FIG. 2 is a perspective view illustrating the bottom side of the semiconductor device illustrated in FIG. 1.
Figure 3:
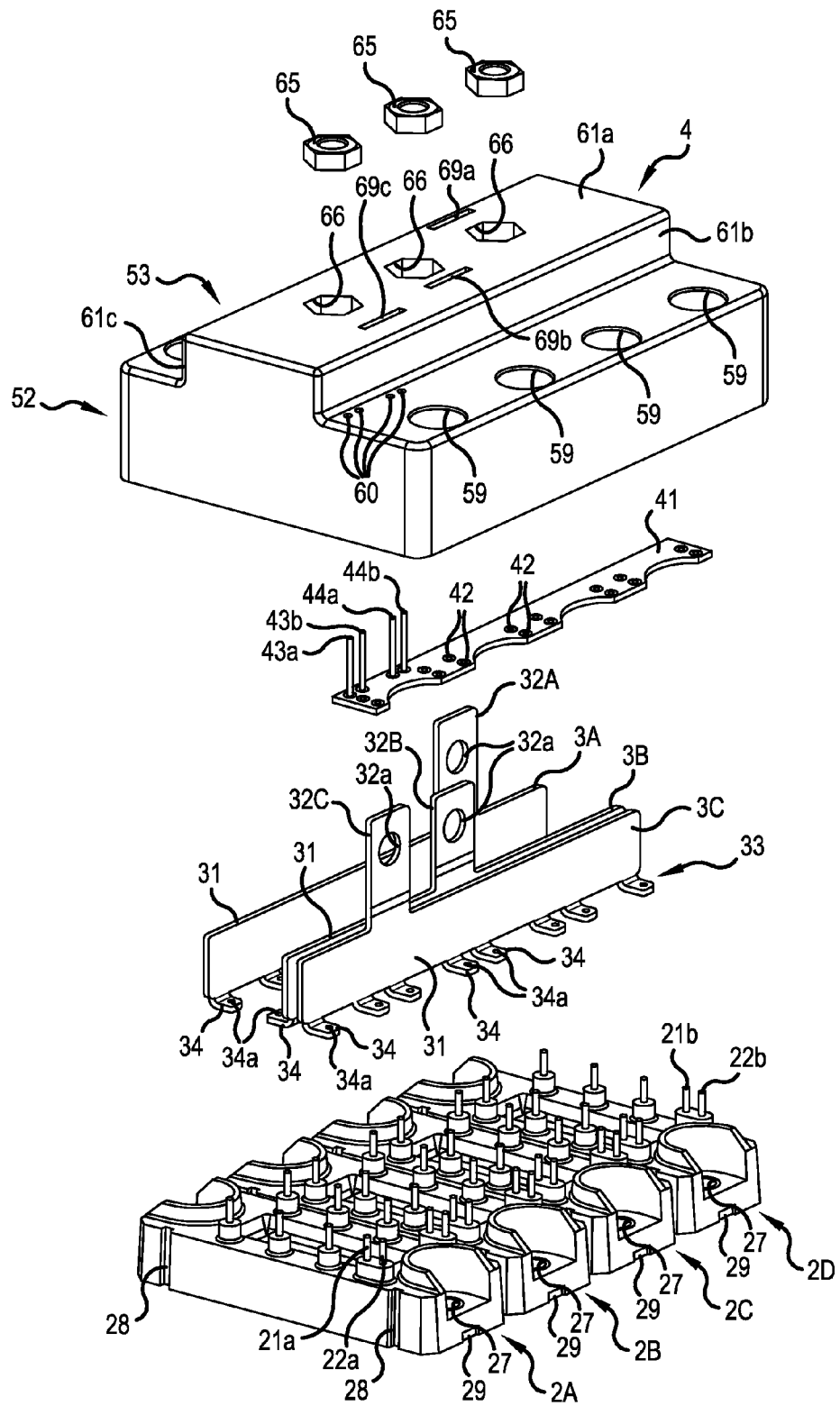
FIG. 3 is an exploded perspective view illustrating the semiconductor device.
Figure 4:
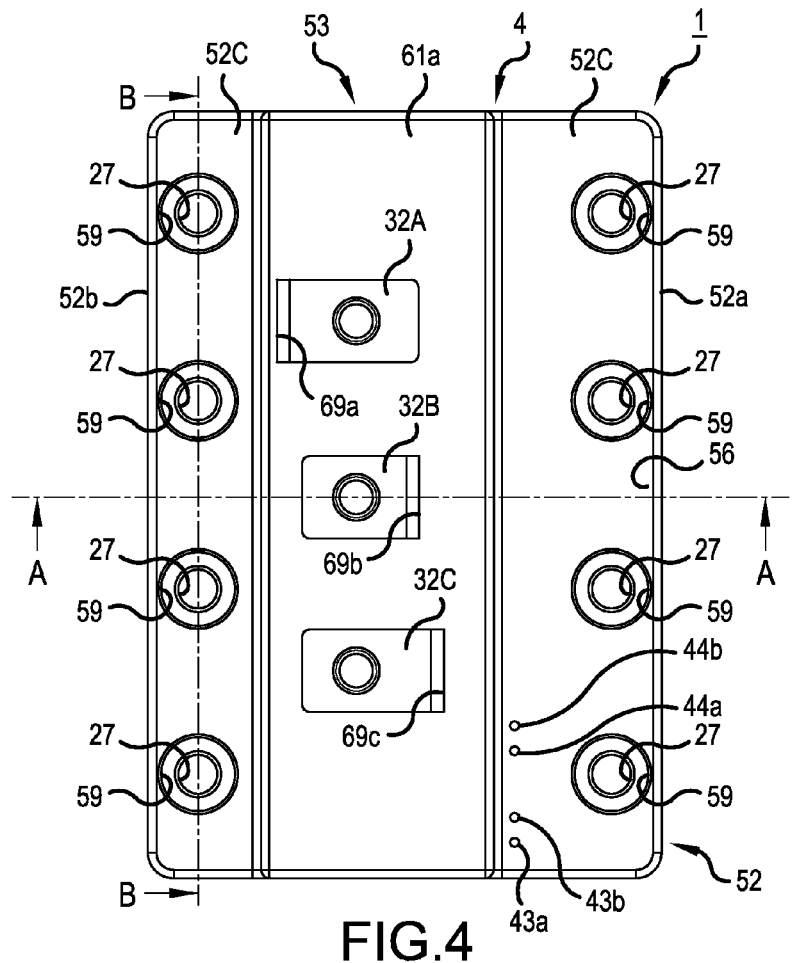
FIG. 4 is a plan view illustrating the semiconductor device.
Figure 5:
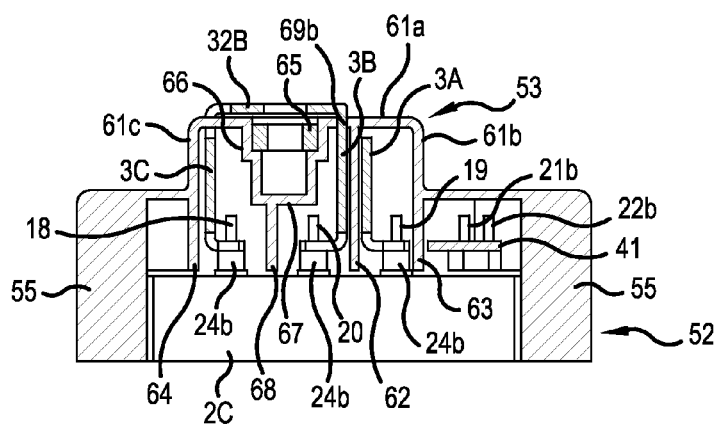
FIG. 5 is a cross-sectional view taken along the line A-A of FIG. 4.
Figure 6:
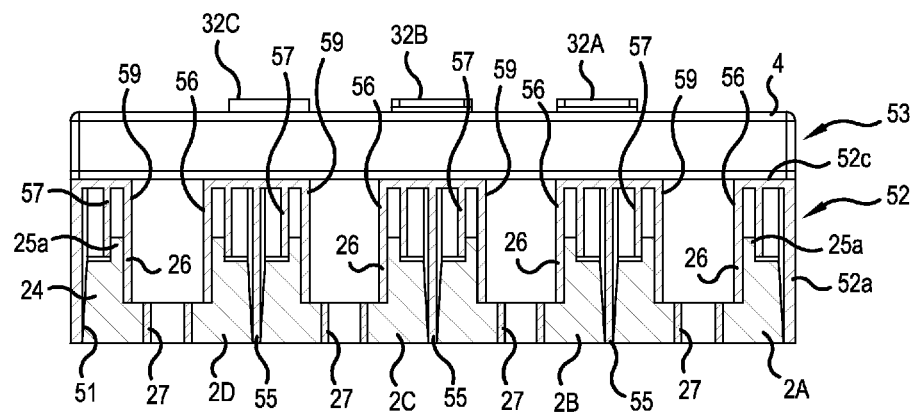
FIG. 6 is a cross-sectional view taken along the line B-B of FIG. 4.

Hereinafter, embodiments of the invention will be described with reference to the drawings. FIG. 1 is a perspective view illustrating the top side of a semiconductor device according to an embodiment of the invention and FIG. 2 is a perspective view illustrating the bottom side of the semiconductor device. FIG. 3 is an exploded perspective view illustrating the semiconductor device. FIG. 4 is a plan view illustrating the semiconductor device. FIG. 5 is a cross-sectional view taken along the line A-A of FIG. 3 and FIG. 6 is a cross-sectional view taken along the line B-B of FIG. 3. As illustrated in FIG. 3, a semiconductor device 1 includes a plurality of power semiconductor modules, for example, four power semiconductor modules 2A to 2D, three main terminal plates 3A to 3C that individually connect connection terminals of the power semiconductor modules 2A to 2D, and a module storage case 4 that accommodates the power semiconductor modules 2A to 2D and the main terminal plate 3A to 3C.

Figure 7:
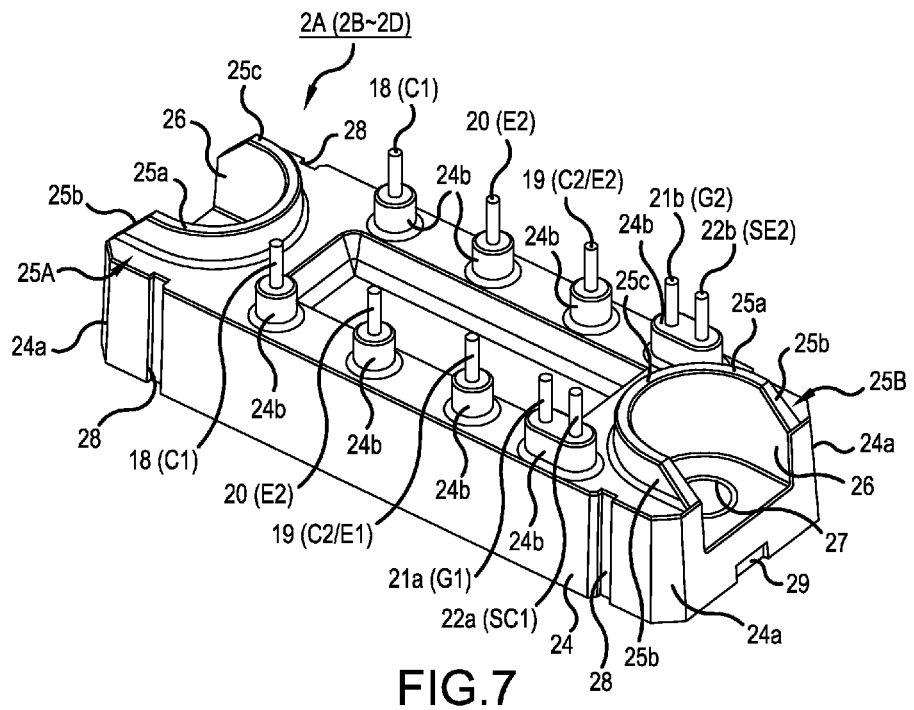
FIG. 7 is a perspective view illustrating the top side of a power semiconductor module.
Figure 8:
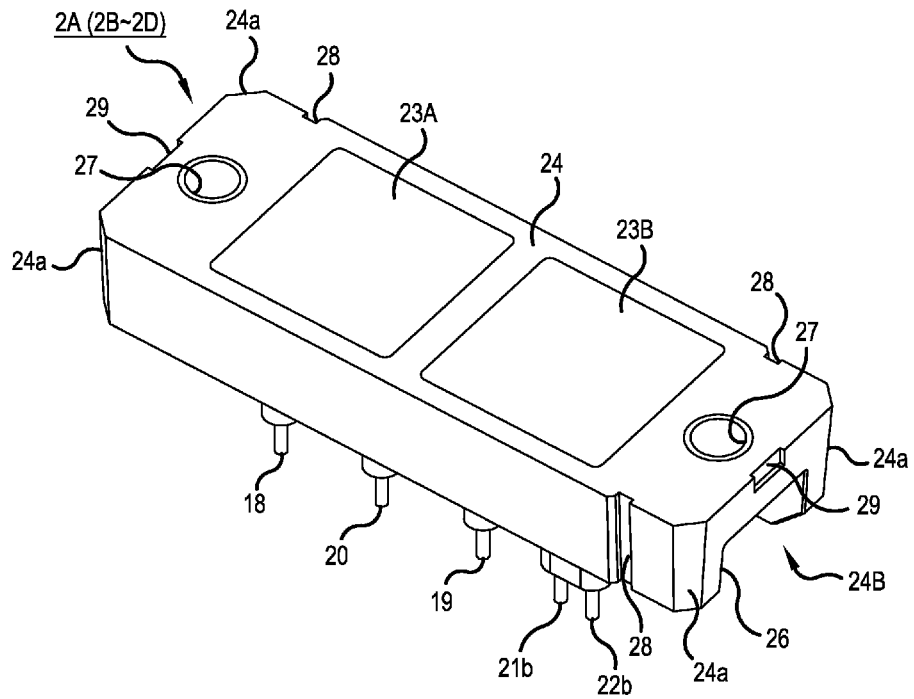
FIG. 8 is a perspective view illustrating the bottom side of the power semiconductor module.
Figure 9:
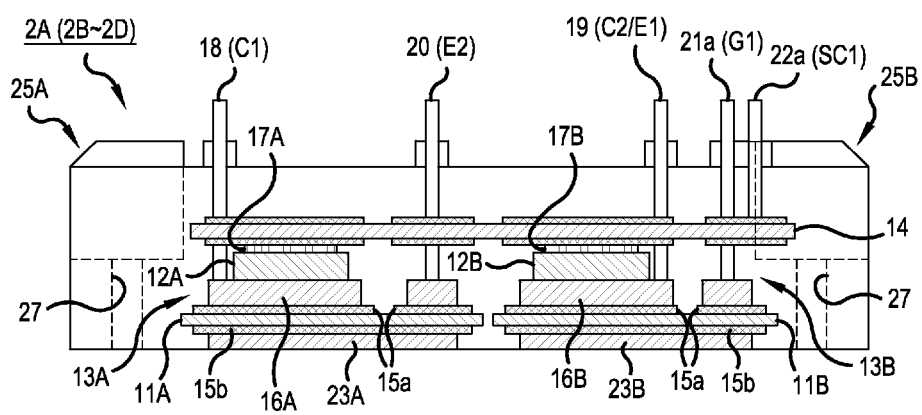
FIG. 9 is a cross-sectional view illustrating an example of the internal structure of the power semiconductor module.

As can be seen from FIGS. 7 to 9, an example of each of the power semiconductor modules 2A to 2D includes two semiconductor circuits 13A and 13B which are respectively formed by mounting semiconductor chips 12A and 12B on insulating substrates 11A and 11B and a wiring substrate 14 which forms a common wiring circuit on the upper side of the semiconductor circuits 13A and 13B. In the semiconductor circuits 13A and 13B, the semiconductor chips 12A and 12B are formed by power devices, such as insulating gate bipolar transistors (IGBTs), power metal-oxide-semiconductor field-effect transistors (MOSFETs), or free wheeling diodes (FWDs).

For ease of understanding of illustration, in FIG. 9, only one semiconductor chip 12A and only one semiconductor chip 12B which are respectively provided on one insulating substrate 11A and one insulating substrate 11B are illustrated. However, in practice, a switching device, such as an IGBT, and an FWD are provided on a conductor layer which is provided on the front surface side of each of the insulating substrates 11A and 11B and are connected as illustrated in an equivalent circuit of FIG. 10. The semiconductor chips 12A and 12B are various types of power devices. The semiconductor chips 12A and 12B may be formed on a silicon substrate or a SiC substrate.

The insulating substrates 11A and 11B are made of ceramics, such as alumina with high conductivity, and copper films 15a and 15b forming conductor layers are attached to the front and rear surfaces of the insulating substrates 11A and 11B. A predetermined circuit pattern for connecting a plurality of power devices which are provided on a conductor layer (copper film 15a) is formed in the conductor layer provided on the front surface of the insulating substrate 11A. The semiconductor chip 12A is provided on the copper film 15a on the front surface of the insulating substrate 11A, with a copper block 16A interposed therebetween. Similarly, a predetermined circuit pattern for connecting a plurality of power devices which are provided on a conductor layer is formed in the copper film 15a provided on the front surface of the insulating substrate 11B. The semiconductor chip 12B is provided on the copper film 15a on the front surface of the insulating substrate 11B, with a copper block 16B interposed therebetween.

As can be seen from the equivalent circuit diagram illustrated in FIG. 10, an inverse parallel circuit of a switching device (hereinafter, simply referred to as a transistor) Q1 and an FWD (hereinafter, referred to as a diode) D1 and an inverse parallel circuit of a transistor Q2 and a diode D2 are connected in series to the copper films 15a and 15b of the insulating substrates 11A and 11B, respectively. The semiconductor chip (power device) which is provided on one insulating substrate 11A or 11B may equivalently form the inverse parallel circuit of the transistor and the diode illustrated in FIG. 10. Therefore, the transistor or/and the diode may be provided with a plurality of semiconductor chips with the same rating.

FIG. 9 illustrates a state in which the semiconductor chip 12A forming the transistor Q1 and a semiconductor chip (not illustrated) forming the diode D1 on the rear side of the semiconductor chip 12A are arranged on the copper film 15a of the insulating substrate 11A in the front-rear direction. Similarly, the semiconductor chip 12B forming the transistor Q2 and a semiconductor chip (not illustrated) forming the diode D2 on the rear side of the semiconductor chip 12B are arranged on the copper film 15a of the insulating substrate 11B in the front-rear direction. That is, the transistor Q1 and the diode D1 are connected in inverse parallel by the copper film 15a on the insulating substrate 11A and the wiring substrate 14, and the transistor Q2 and the diode D2 are connected in inverse parallel by the copper film 15a on the insulating substrate 11B and the wiring substrate 14. Two inverse parallel circuits formed by a pair of the transistor Q1 and the diode D1 and a pair of the transistor Q2 and the diode D2 are connected in series to the wiring substrate 14, which is provided over the inverse parallel circuits, through post-shaped electrode members 17A and 17B, respectively.

Two semiconductor chips 12A may not be arranged on the copper film 15a of the insulating substrate 11A in the front-rear direction as illustrated in FIG. 9, but may be arranged on the copper film 15a of the insulating substrate 11A in the left-right direction. In addition, similarly, two semiconductor chips 12B may be arranged in the left-right direction. Here, a collector electrode of the transistor Q1 is formed on the lower surface of one of the semiconductor chips 12A and is connected to a pin-shaped conductive body (pin terminal) 18 through the copper block 16A. The pin-shaped conductive body 18 is a main terminal (collector terminal C1) of each of the power semiconductor modules 2A to 2D. A collector electrode of the transistor Q2 is formed on the rear surface of the semiconductor chip 12B and is connected to a pin-shaped conductive body (pin terminal) 19 through the copper block 16B. The pin-shaped conductive body 19 is a main terminal (collector/emitter terminal C2/E1) of each of the power semiconductor modules 2A to 2D. The emitter electrodes and the gate electrodes of the transistors Q1 and Q2 are formed on the front surfaces of the semiconductor chips 12A and 12B and are connected to the wiring substrate 14 through the electrode members 17A and 17B, respectively. Of the emitter electrodes and the gate electrodes, the emitter electrode of the transistor Q1 is connected to the pin-shaped conductive body (pin terminal) 19 through the wiring substrate 14, and the emitter electrode of the transistor Q2 is connected to a pin-shaped conductive body (pin terminal) 20 through the wiring substrate 14. The pin-shaped conductive body 20 is a main terminal (emitter terminal E2) of each of the power semiconductor modules 2A to 2D. The pin-shaped conductive bodies 18, 19, and 20 are all connection terminals for connection to a strip-shaped terminal plate body, which will be described below.

As illustrated in FIG. 7, two pin-shaped conductive bodies 18, two pin-shaped conductive bodies 19, and two pin-shaped conductive bodies 20 are symmetrically formed with respect to the center line of each of the power semiconductor modules 2A to 2D in the width direction. Each of the power semiconductor modules 2A to 2D includes a total of four pin-shaped conductive bodies (pin terminals) 21a, 21b, 22a, and 22b for auxiliary terminals, which are provided outside the pin-shaped conductive bodies 19 in the longitudinal direction. In this case, two pin-shaped conductive bodies for auxiliary terminals are arranged outside each pin-shaped conductive body 19 in the longitudinal direction. The pin-shaped conductive bodies 21a and 21b are connected to the wiring substrate 14 and form gate terminals G1 and G2 which supply gate control signals to the gate electrodes of the transistors Q1 and Q2 of a half-bridge circuit, respectively. The other two pin-shaped conductive bodies 22a and 22b are control (auxiliary) terminals and form a sense collector terminal SC1 and a sense emitter terminal SE2, which are connected to the collector of the transistor Q1 and the emitter of the transistor Q2, sense a current flowing between the collector and the emitter of the transistors Q1 and Q2, and output sense signals.

As illustrated in FIG. 7, the pin-shaped conductive bodies 18 to 20 for main terminals and the pin-shaped conductive bodies 21a, 21b, 22a, and 22b for auxiliary terminals each protrude upward from an insulating base 24b having a truncated cone shape with a flat upper surface. As illustrated in FIGS. 8 and 9, copper blocks 23A and 23B with a square plate shape, which will be heat dissipation members, are connected to the copper films 15b on the rear surfaces of the insulating substrates 11A and 11B, respectively. The lower surfaces of the copper blocks 23A and 23B are flush with the bottom of each of the power semiconductor modules 2A to 2D or slightly protrude from the bottom.

Each component of the power semiconductor modules 2A to 2D is formed of, for example, an epoxy resin material, which is a thermosetting resin, by molding and an element, such as a switching device or an FWD provided in the power semiconductor module is protected. As a result, each of the power semiconductor modules 2A to 2D is formed as a molded body 24 with a rectangular parallelepiped shape. The molded body 24 has a rectangular shape as a whole in a plan view, as illustrated in FIGS. 7 and 8.

As illustrated in FIGS. 6 and 7, insulating wall portions 25A and 25B are formed at both ends of the molded body 24 in the longitudinal direction. Each of the insulating wall portions 25A and 25B includes a U-shaped protruding portion 25c including a semicylindrical protruding portion 25a which has a relatively large diameter, is formed inside the end surface of the molded body 24 in the longitudinal direction, and protrudes from the surface and a side wall portion 25b that extends from both end surfaces of the semicylindrical protruding portion 25a to the end surface of the molded body 24 in the tangential direction. In addition, each of the insulating wall portions 25A and 25B includes a concave portion 26 that is connected to the inner circumferential surface of the U-shaped protruding portion 25c, extends to a depth corresponding to about half the thickness of the molded body 24, and has an open end surface.

An attachment hole 27, which has the central axis of the semicylindrical protruding portion 25a as its center, is formed in the bottom of the concave portion 26 forming each of the insulating wall portions 25A and 25B so as to pass through the bottom of the molded body 24. Here, the inside diameter of the semicylindrical protruding portion 25a of each of the insulating wall portions 25A and 25B is set to a value greater than the diameter of the head of a fixing tool, such as an attachment bolt or an attachment screw, which is inserted into the attachment hole 27, and is also set to a wall surface height which can sufficiently ensure a creeping distance required between an adjacent pin-shaped conductive body 18, 19, 21a, 21b, 22a, or 22b and the head of the fixing tool.

In the above-mentioned example, each of the insulating wall portions 25A and 25B includes the U-shaped protruding portion 25c including the side wall portion 25b which extends from both end surfaces of the semicylindrical protruding portion 25a to the end surface of the molded body 24 in the tangential direction. However, the invention is not limited to this shape. For example, the semicylindrical protruding portion 25a may not have the semicircular shape, but may have a polygonal shape. The inside diameter of the semicylindrical protruding portion 25a may be set to a value greater than the diameter of the head of the fixing tool, such as an attachment bolt or an attachment screw which is inserted into the attachment hole 27, and may also be set to a wall surface height which can sufficiently ensure the creeping distance required between an adjacent pin-shaped conductive body 18, 19, 21a, 21b, 22a, or 22b and the head of the fixing tool.

Figure 11:
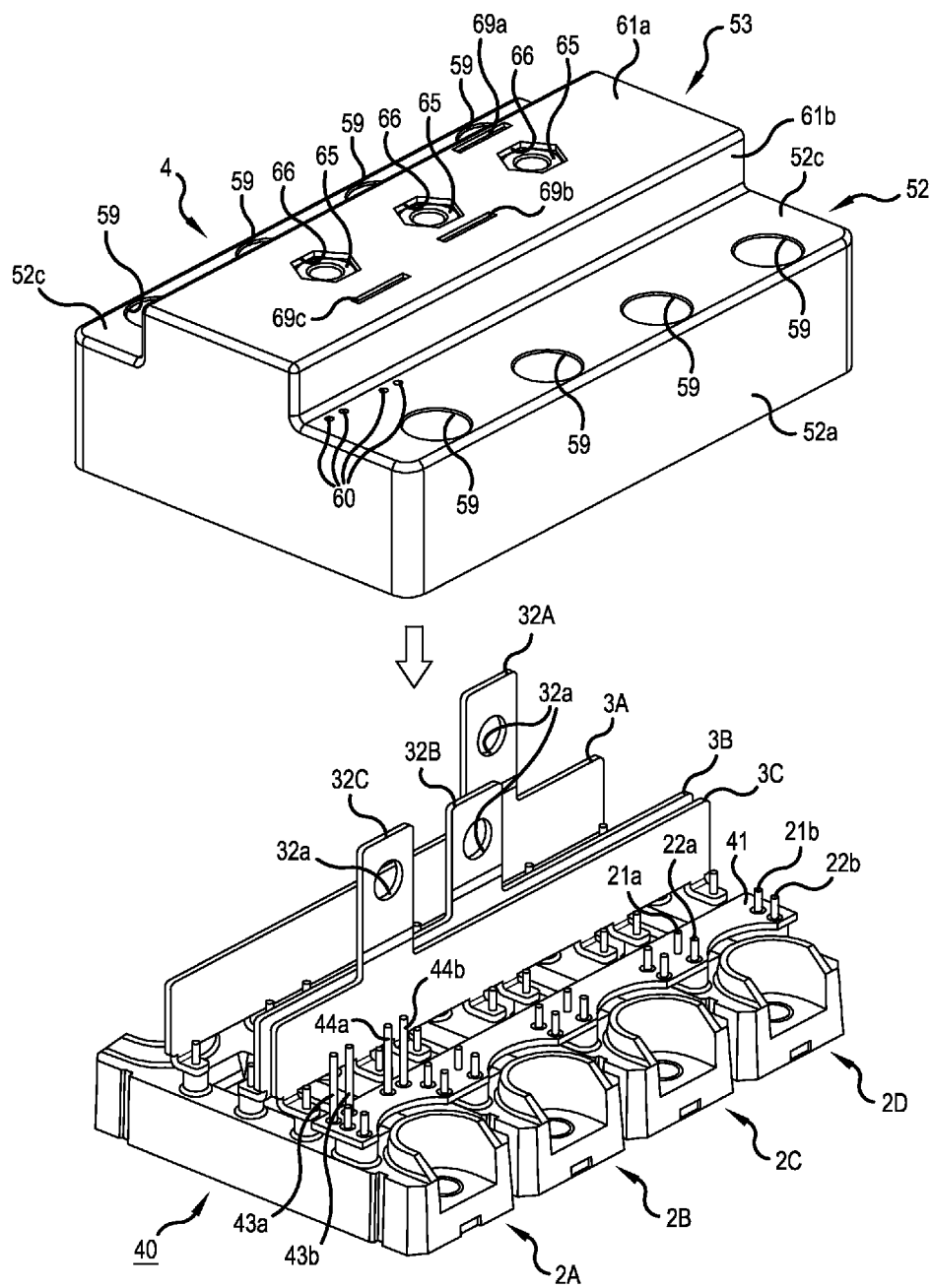
FIG. 11 is a perspective view illustrating a module storage case and a module aggregate formed by connecting the power semiconductor modules using main terminal plates.

In the molded body 24, four fitting grooves 28, which extend in the up-down direction, are formed in the side surfaces facing the insulating wall portions 25A and 25B, and snap-fitting concave portions 29 are formed below the open end surfaces of the concave portions 26 in the insulating wall portions 25A and 25B. As illustrated in FIGS. 3 and 11, the main terminal plates 3A, 3B, and 3C are configured so as to individually connect the pin-shaped conductive bodies 19, 20 and 18 in the state in which the four power semiconductor modules 2A to 2D are arranged in parallel, with the pin-shaped conductive bodies 18 to 22b up and with a short distance between the left and right surfaces. That is, the main terminal plates 3A to 3C include strip-shaped terminal plate bodies 31, bending plate portions 32A to 32C, and connection terminal holding portions 33, respectively.

The terminal plate body 31 is a strip-shaped plate that extends in a direction in which it traverses the power semiconductor modules 2A to 2D, which are arranged in parallel, and has a surface parallel to the central axis of the attachment hole 27 in each of the power semiconductor modules 2A to 2D and the extension direction of the pin-shaped conductive bodies 18 to 20, 21a, 21b, 22a, and 22b. Each of the bending plate portions 32A to 32C protrudes upward from the upper surface of the terminal plate body 31 and becomes a main terminal segment when a portion that protrudes from the module storage case 4, which will be described below, is bent. A bolt insertion hole 32a is formed in each of the bending plate portions 32A to 32C.

The connection terminal holding portion 33 protrudes from the lower surface of the terminal plate body 31 in one of the left and right directions and each of the pin-shaped conductive bodies 19, 20, and 18 in each of the power semiconductor modules 2A to 2D is inserted into the connection terminal holding portion 33 and is held therein. The connection terminal holding portion 33 includes a connection piece 34 which is bent and extends from the lower surface of the terminal plate body 31 in correspondence with each of the pin-shaped conductive bodies 19, 20, and 18 in each of the power semiconductor modules 2A to 2D. An insertion hole 34a into which each of the pin-shaped conductive bodies 18 to 20 is inserted is formed in the connection piece 34 in the up-down direction.

Figure 19:
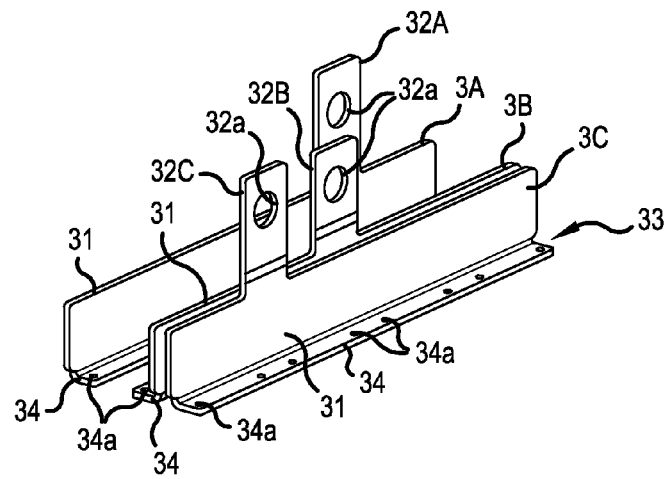
FIG. 19 is a perspective view illustrating a modification of the main terminal plate.

As illustrated in FIG. 3, in the connection terminal holding portion 33, the connection pieces 34 may be provided so as to correspond to the pin-shaped conductive bodies 18, 20, and 19. In addition, as illustrated in FIG. 19, one end of the terminal plate body 31 may be bent to form a continuous connection piece 34. When the connection pieces 34 are formed so as to correspond to the pin-shaped conductive bodies 18, 20, and 19, it is possible to obtain flexibility and to suppress thermal diffusion when laser welding is performed to electrically connect the pin-shaped conductive bodies 18, 20, and 19.

As illustrated in FIG. 11, with the power semiconductor modules 2A to 2D arranged in parallel, the pin-shaped conductive bodies 18 are inserted into the insertion holes 34a formed in the connection pieces 34 of the main terminal plate 3A and the bottom of each connection piece 34 comes into contact with the upper surface of the insulating base 24b. In this way, the pin-shaped conductive bodies 18 are positioned. Then, the insertion holes 34a of the main terminal plate 3A are electrically connected to the pin-shaped conductive body 18. Similarly, the pin-shaped conductive bodies 20 are inserted into the insertion holes 34a formed in the connection pieces 34 of the main terminal plate 3B and the bottom of each connection piece 34 comes into contact with the upper surface of the insulating base 24b. In this way, the pin-shaped conductive bodies 20 are positioned. Then, insertion holes 34a of the main terminal plate 3B are electrically connected to the pin-shaped conductive body 20. In addition, the pin-shaped conductive bodies 19 are inserted into the insertion holes 34a formed in the connection pieces 34 of the main terminal plate 3C and the bottom of each connection piece 34 comes into contact with the upper surface of the insulating base 24b. In this way, the pin-shaped conductive bodies 19 are positioned. Then, the insertion holes 34a of the main terminal plate 3C are electrically connected to the pin-shaped conductive body 19. In this way, the power semiconductor modules 2A to 2D are connected to each other by the main terminal plates 3A to 3C to form a module aggregate 40.

When the main terminal plates 3A, 3B, and 3C and the pin-shaped conductive bodies 18, 20 and 19 in each of the power semiconductor modules 2A to 2D are bonded to each other by, for example, lead (Pb)-free solder including tin (Sn), they are assembled in the shape illustrated in FIG. 11 and paste solder is applied to the pin-shaped conductive bodies 18, 20, and 19 and is then heated. In the bonding, a general flow solder may be used or the following method may be used to perform strong bonding.

That is, the pin-shaped conductive bodies 18, 20, and 19 may be made of a material with high conductivity, such as a copper (Cu)-based material or an aluminum (Al)-based material. However, when ease of soldering is considered, a surface treatment with a nickel (Ni) or tin-based material may be performed for the pin-shaped conductive bodies 18, 20, and 19 to improve the wettability of soldering, thereby improving mounting efficiency.

In addition, an excited laser beam may be radiated to each of the pin-shaped conductive bodies 18, 20 and 19 in the power semiconductor modules 2A to 2D in a spot manner to locally heat the pin-shaped conductive bodies 18, 20 and 19, thereby bonding the main terminal plates 3A to 3C. In this case, for example, a silver (Ag) or gold (Au)-based alloy material may be used, in addition to the copper or aluminum-based material with high conductivity. When copper, aluminum, or silver is used, local diffusion bonding is performed between the components of the same type. However, when heat receiving stability in a short time is considered, silver with high conductivity is most suitable. In addition, when gold is used, a tin-based film is applied onto the surface of the pin terminal and the bonding of tin and gold materials is performed at a low melting point. Therefore, there is a merit that bonding power is less than that when copper, aluminum, or silver is used. In addition, after the material is solidified, a eutectic component of tin and gold form a bonding portion. Therefore, heat resistance is expected to be higher than that in general soldering.

When the pin-shaped conductive bodies 18, 20 and 19 in each of the power semiconductor modules 2A to 2D are connected to the main terminal plates 3A to 3C, the pin-shaped conductive bodies 21 and 22 in each of the power semiconductor modules 2A to 2D are inserted into through holes 42 which are formed in a printed circuit board 41 illustrated in FIGS. 3 and 11 and the through holes 42 and the pin-shaped conductive bodies 21 and 22 are electrically connected to each other by, for example, soldering.

Although not illustrated in the drawings, a conductive pattern for supplying a gate signal to the gate of the IGBT, which is formed in each of the semiconductor chips 12A and 12B, and a conductive pattern for outputting a sense emitter current to the outside are formed on the printed circuit board 41.

Pin-shaped external connection terminals 43a, 43b, 44a, and 44b are formed on the printed circuit board 41 so as to protrude from the surface of the printed circuit board 41. The external connection terminals 43a, 43b, 44a, and 44b are connected to the conductive pattern formed on the printed circuit board 41 and are electrically connected to the pin-shaped conductive bodies 21a, 21b, 22a, and 22b in each of the power semiconductor modules 2A to 2D, respectively.

The electrical connection between the pin-shaped external connection terminals 43a, 43b, 44a, and 44b and the pin-shaped conductive bodies 21a, 21b, 22a, and 22b in each of the power semiconductor modules 2A to 2D is not limited to the case in which the printed circuit board 41 is used, but may be achieved by an electrical connection means, such as a wire harness.

The module aggregate 40 in which the four power semiconductor modules 2A to 2D are integrated by the main terminal plates 3A to 3C is accommodated in the module storage case 4. As illustrated in FIGS. 4 to 6 and FIG. 12, the module storage case 4 is formed of a thermoplastic resin by injection molding and has a box shape which has a relatively small thickness, has flexibility, has a convex shape in a side view, and has an opening portion 51 as its lower end. The module storage case 4 includes a module storage region 52 which has a rectangular parallelepiped shape and into which the power semiconductor modules 2A to 2D are inserted from the opening portion 51, which is the lower end and are then held, and a main terminal plate storage region 53 which protrudes upward from the center of the module storage region 52 in the front-rear direction and accommodates the main terminal plates 3A to 3C.

Figure 12:
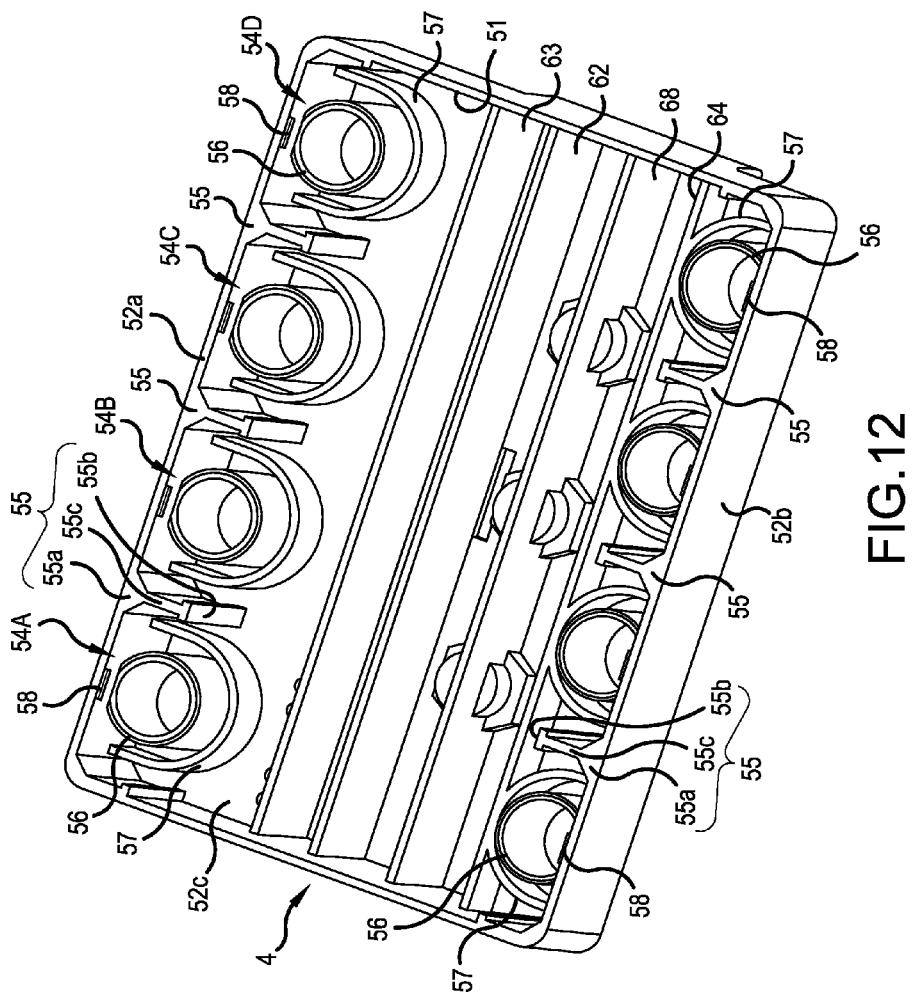
FIG. 12 is a perspective view illustrating the bottom side of the module storage case.

As illustrated in FIG. 12, in the module storage region 52, guide protrusions 55, which define individual storage regions 54A to 54D that accommodate the power semiconductor modules 2A to 2D with predetermined flexibility in attachment such that the position of the power semiconductor module 2A to 2D can be adjusted during attachment, are formed on the inner surfaces of front and rear side plates 52a and 52b so as to protrude inward. The guide protrusion 55 includes a triangular-prism-shaped base portion 55a, which faces a C chamfered portion 24a at each of four corners of the power semiconductor modules 2A to 2D, and a T-shaped partition wall 55c, which extends inward from the leading end of the triangular-prism-shaped base portion 55a and has, at its leading end, a protruding fitting portion 55b that is fitted to the fitting groove 28 of each of the power semiconductor modules 2A to 2D and guides the power semiconductor module.

Each of the individual storage regions 54A to 54D includes cylindrical portions 56, which protrude downward from an upper surface plate 52c and are fitted to the inner circumferential surfaces of the insulating wall portions 25A and 25B of each of the power semiconductor modules 2A to 2D, and U-shaped protruding portions 57, which are formed on the outer circumferential side of the cylindrical portions 56 and are fitted to the outer circumferential surfaces of the U-shaped protruding portions 25c of the insulating wall portions 25A and 25B. In addition, each of the individual storage regions 54A to 54D includes snap-fitting protrusions 58, which are provided in the front and rear side plates 52a and 52b at positions facing the central axes of the cylindrical portions 56 in the vicinity of the opening portion 51.

Each of the individual storage regions 54A to 54D includes insertion holes 59 for attachment provided in the upper surface plate 52c at positions corresponding to the inner circumferential surfaces of the cylindrical portions 56 and are connected to the cylindrical portions 56. In addition, pin insertion holes 60, through which the external connection terminals 43a, 43b, 44a, and 44b protrude toward the outside, are formed in the upper surface plate 52c of the module storage region 52 at positions that face the external connection terminals 43a, 43b, 44a, and 44b formed in the printed circuit board 41 of the module aggregate 40.

The width of the individual storage regions 54A to 54D is set such that the individual storage regions 54A to 54D do not fit and hold the power semiconductor modules 2A to 2D, but accommodate and hold the power semiconductor modules 2A to 2D, with a slight gap (for example, about 50 μm to 200 μm) therebetween. Therefore, the individual storage regions 54A to 54D accommodate and hold the power semiconductor modules 2A to 2D with a predetermined flexibility in attachment such that the position of the power semiconductor modules 2A to 2D can be adjusted during attachment, with the power semiconductor modules 2A to 2D being individually accommodated in the individual storage regions 54A to 54D.

As illustrated in FIG. 5, the main terminal plate storage region 53 includes an insulating partition wall 62, which protrudes downward from an upper surface plate 61a and is inserted between the main terminal plates 3A and 3B, an insulating partition wall 63, which protrudes downward from a front side plate 61b and is inserted between the pin-shaped conductive bodies 19 and the pin-shaped conductive bodies 21a and 21b of the power semiconductor modules 2A to 2D, and an insulating partition wall 64, which protrudes downward from a rear side plate 61c and insulates the rear side of the main terminal plate 3C.

In addition, the main terminal plate storage region 53 includes nut storage concave portions 66, which are formed in the left-right direction between the insulating partition walls 62 and 64 in the upper surface plate 61a at positions corresponding to the bending plate portions 32 of the main terminal plates 3A to 3C and accommodate nuts 65, bolt insertion concave portions 67, which are connected to the bottoms of the nut storage concave portions 66 and into which the leading ends of bolts are inserted, and an insulating partition wall 68, which protrudes downward from the upper surface plate 61a, extends downward along the outer circumferential surfaces of the nut storage concave portions 66 and the bolt insertion concave portions 67, and insulates the pin-shaped conductive body 18 from the pin-shaped conductive body 20. Furthermore, the main terminal plate storage region 53 includes insertion holes 69a, 69b, and 69c formed in the upper surface plate 61a and through which the bending plate portions 32 of the main terminal plates 3A, 3B, and 3C protrude toward the outside.

As illustrated in FIG. 11, the module aggregate 40 is inserted into the module storage case 4 having the above-mentioned structure from the opening portion 51 and is held in the module storage case 4. That is, as illustrated in FIG. 11, the module aggregate 40 is mounted on a flat surface of a mounting table (not illustrated). In this state, the module storage case 4 is moved down from the upper side and the bending plate portions 32A, 32B, and 32C of the main terminal plates 3A, 3B, and 3C are inserted into the insertion holes 69a, 69b, and 69c in the main terminal plate storage region 53 of the module storage case 4. At the same time, the external connection terminals 43a, 43b, 44a, and 44b of the printed circuit board 41 are inserted into the pin insertion holes 60 in the module storage region 52 of the module storage case 4. In addition, the protruding fitting portions 55b of the guide protrusions 55 are fitted to the fitting grooves 28 in each of the power semiconductor modules 2A to 2D. In this state, the module storage case 4 is further moved down.

When the snap-fitting protrusions 58, which are formed in each of the individual storage regions 54A to 54D of the module storage case 4, reach the bottoms of the concave portions 26 forming the insulating wall portions 25A and 25B of the power semiconductor modules 2A to 2D, they come into contact with the front and rear end surfaces of the power semiconductor modules 2A to 2D. Then, the module storage case 4 is moved down while the front and rear side plates 52a and 52b are bent toward the outside. Then, the lower end surface of the module storage case 4 reaches the lower ends of the power semiconductor modules 2A to 2D and the snap-fitting protrusion 58 reach the snap-fitting concave portions 29 which are formed in the lower surfaces of the power semiconductor modules 2A to 2D. In this state, the snap-fitting protrusions 58 are bent by the elasticity of the front and rear side plates 52a and 52b and are fitted to the snap-fitting concave portions 29.

Therefore, the power semiconductor modules 2A to 2D are held in the individual storage regions 54A to 54D of the module storage case 4, without any contact between the side surfaces, and have a predetermined flexibility in attachment such that the positions thereof can be adjusted when the power semiconductor modules 2A to 2D are attached. When the module storage case 4 is lifted up from the mounting table, the power semiconductor modules 2A to 2D are held, without being detached.

In this state, the nuts 65 are inserted into the nut storage concave portions 66 of the module storage case 4 and the bending plate portions 32A, 32B, and 32C of the main terminal plates 3A, 3B, and 3C, which protrude from the upper surface plate 61a of the module storage case 4, are bent as illustrated in FIGS. 1, 4, and 5 to cover the nut storage concave portions 66. Therefore, it is possible to prevent the nuts 65 from coming off. In this case, since the main terminal plates 3A, 3B, and 3C are fixed to the pin-shaped conductive bodies 19, 20, and 18 of each of the power semiconductor modules 2A to 2D by, for example, soldering, it is possible to prevent the main terminal plates 3A, 3B, and 3C from coming off from the power semiconductor modules 2A to 2D of the module storage case 4.

In addition, the protruding fitting portions 55b that are formed at the leading ends of the T-shaped partition walls 55c forming the guide protrusions 55, which define the individual storage regions 54A to 54D of the module storage case 4, are fitted to the fitting grooves 28 of the power semiconductor modules 2A to 2D. Therefore, even when the module storage case 4 is made of a thin thermoplastic resin which has flexibility and low tenacity, it is possible to reliably prevent the front and rear side plates 52a and 52b of the module storage case 4 from being bent toward the outside. As a result, it is possible to reliably prevent the power semiconductor modules 2A to 2D from coming off from the module storage case 4.

When the bending plate portions 32A to 32C of the main terminal plates 3A to 3C protrude from the insertion holes 69a to 69c of the module storage case 4 and the protruding portions are bent, a gap of, for example, 0.5 mm or more, which can prevent the nut 65 from coming off, may be formed between the bending plate portions 32A to 32C and the upper surface plate 61a in the main terminal plate storage region 53 of the module storage case 4, as illustrated in FIGS. 5 and 6. As such, when the gap is formed between the bending plate portions 32A to 32C and the upper surface plate 61a in the main terminal plate storage region 53 of the module storage case 4, the module aggregate 40 can be moved within a distance corresponding to the gap in the up-down direction. Therefore, it is possible to ensure flexibility in the attachment of the power semiconductor modules 2A to 2D in the up-down direction.

Figure 13:
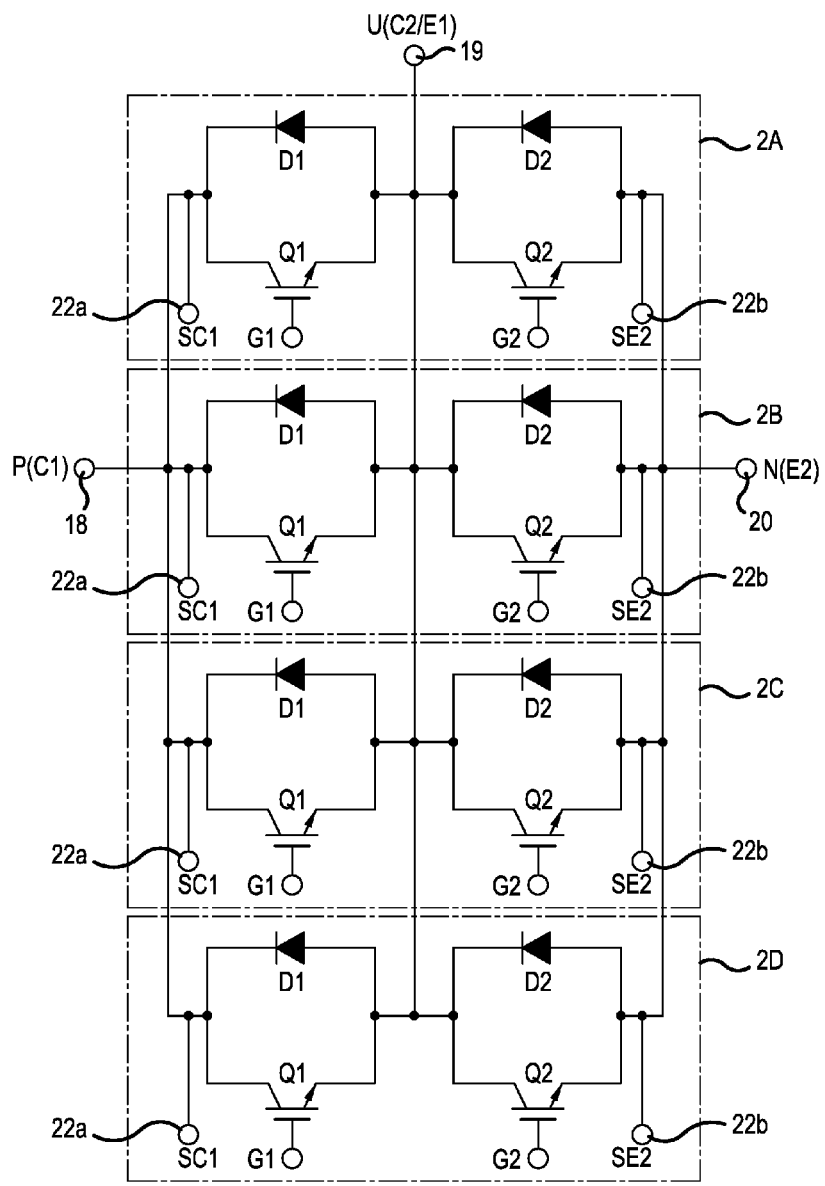
FIG. 13 is a circuit diagram illustrating an equivalent circuit of the semiconductor device.

In the state in which the module storage case 4 is mounted on the module aggregate 40, as illustrated in FIG. 4, the attachment insertion holes 59 of the module storage case 4 are connected to the attachment holes 27 of the power semiconductor modules 2A to 2D in a plan view. In this way, the module aggregate 40 is accommodated and held in the module storage case 4 to form the semiconductor device 1. Since the four power semiconductor modules 2A to 2D having the equivalent circuit structure illustrated in FIG. 10 are connected to each other by the main terminal plates 3A to 3C, the overall equivalent circuit of the semiconductor device 1 has a structure in which four equivalent circuits illustrated in FIG. 10 are connected in parallel to each other, as illustrated in FIG. 13.

That is, the pin-shaped conductive bodies 18, which are the collector terminals C1 of the power semiconductor modules 2A to 2D, are electrically connected to each other by the main terminal plate 3A and are connected to a positive electrode terminal P of a DC power supply. In addition, the pin-shaped conductive bodies 20, which are the emitter terminals E2 of the power semiconductor modules 2A to 2D, are electrically connected to each other by the main terminal plate 3B and are connected to a negative electrode terminal N of the DC power supply. The pin-shaped conductive bodies 19, which are external output terminals U (C2/E1) of the power semiconductor modules 2A to 2D, are electrically connected to each other by the main terminal plate 3C and are connected to an external output terminal U (C2/E1).

The pin-shaped conductive bodies 21a and 21b, which are the gate terminals of the IGBTs Q1 and Q2 in each of the power semiconductor modules 2A to 2D, are connected to each other by the conductive pattern of the printed circuit board 41 and are connected to the gate terminals G1 and G2 through the external connection terminals 43a and 43b. In addition, the pin-shaped conductive bodies 22a and 22b, which are the sense collector terminal and the sense emitter terminal of the IGBTs Q1 and Q2, are connected to each other by the conductive pattern of the printed circuit board 41 and are connected to the sense collector terminal SC1 and the sense emitter terminal SE2 through the external connection terminals 44a and 44b.

Therefore, in the semiconductor device 1, for example, it is possible to form one phase of an inverter device as a power conversion device. Here, the number of power semiconductor modules 2A to 2D accommodated in the module storage case 4 can be set on the basis of the amount of current treated by the inverter device to be configured. That is, when the amount of current is half the amount of current of a full-featured device using the four power semiconductor modules 2A to 2D, two power semiconductor modules 2A and 2B may be connected by the main terminal plates 3A to 3C to form the module aggregate 40 and the module aggregate 40 may be mounted and held in the module storage case 4. Similarly, when the amount of current is one-fourth of the amount of current of the full-featured device, the main terminal plates 3A to 3C may be connected to only one power semiconductor module 2A and may be accommodated and held in the module storage case 4. When the amount of current is three-fourths of the amount of current of the full-featured device, the main terminal plates 3A to 3C may be connected to the three power semiconductor modules 2A to 2C and may be accommodated and held in the module storage case 4.

In the semiconductor device 1, a high voltage is applied to the main terminal plates 3A to 3C and a large amount of current flows through the main terminal plates 3A to 3C. Therefore, the problem is the insulation of the main terminal plates 3A to 3C. In this embodiment, the insulating partition walls 62 to 64 and 68, which isolate the main terminal plates 3A to 3C from each other and also isolate attachment screws 74, which are fixing tools, from each other, are formed in the main terminal plate storage region 53 that accommodates the main terminal plates 3A to 3C.

The insulating partition walls 62 to 64 and 68 extend to the vicinity of the upper surfaces of the power semiconductor modules 2A to 2D, as illustrated in FIG. 5. In addition, the pin-shaped conductive bodies 18 to 20 of the power semiconductor modules 2A to 2D protrude from the insulating bases 24b which protrude from the upper surfaces of the molded bodies of the power semiconductor modules 2A to 2D. Therefore, it is possible to ensure the insulation between the main terminal plates 3A to 3C and the pin-shaped conductive bodies 18 to 20 and to reliably insulate the main terminal plates 3A to 3C from the attachment screws 74 as the fixing tools, which will be described below.

In the semiconductor device 1 having the above-mentioned structure, since a plurality of power semiconductor modules 2A to 2D are accommodated in the module storage case 4, the semiconductor chips 12A and 12B including an IGBT or an FWD which form each of the power semiconductor modules 2A to 2D generate heat. The copper blocks 16A, 16B, 23A, and 23B with high thermal conductivity are provided in order to dissipate the heat. The heat generated from the semiconductor chips 12A and 12B is transferred to the lower surfaces of the power semiconductor modules 2A to 2D through the copper blocks 16A, 16B, 23A, and 23B.

Figure 14:
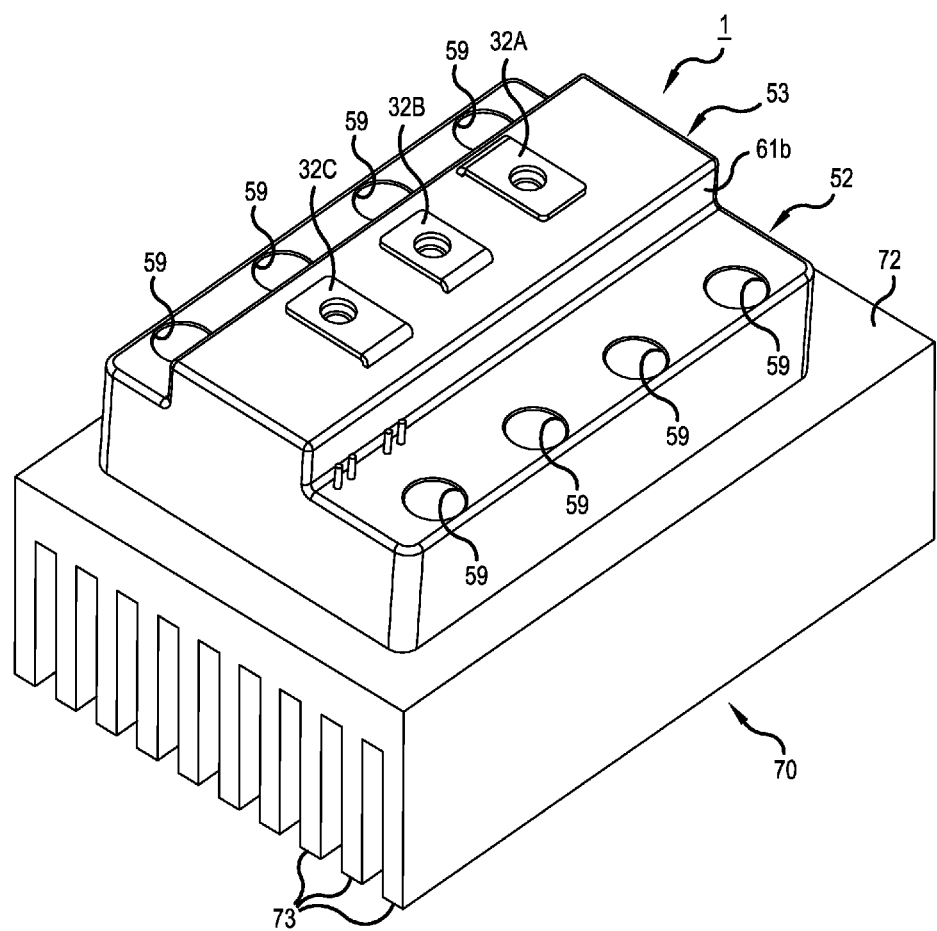
FIG. 14 is a perspective view illustrating a state in which the semiconductor devices are connected to a cooler.

As illustrated in FIG. 2, the copper blocks 23A and 23B arranged on the lower surfaces of the power semiconductor modules 2A to 2D are exposed from the opening portion 51 of the module storage case 4. Therefore, as illustrated in FIG. 14, when the copper blocks 23A and 23B come into contact with a cooler 70, such as a heat sink, it is possible to effectively cool the semiconductor chips 12A and 12B which generate heat.

Figure 15:
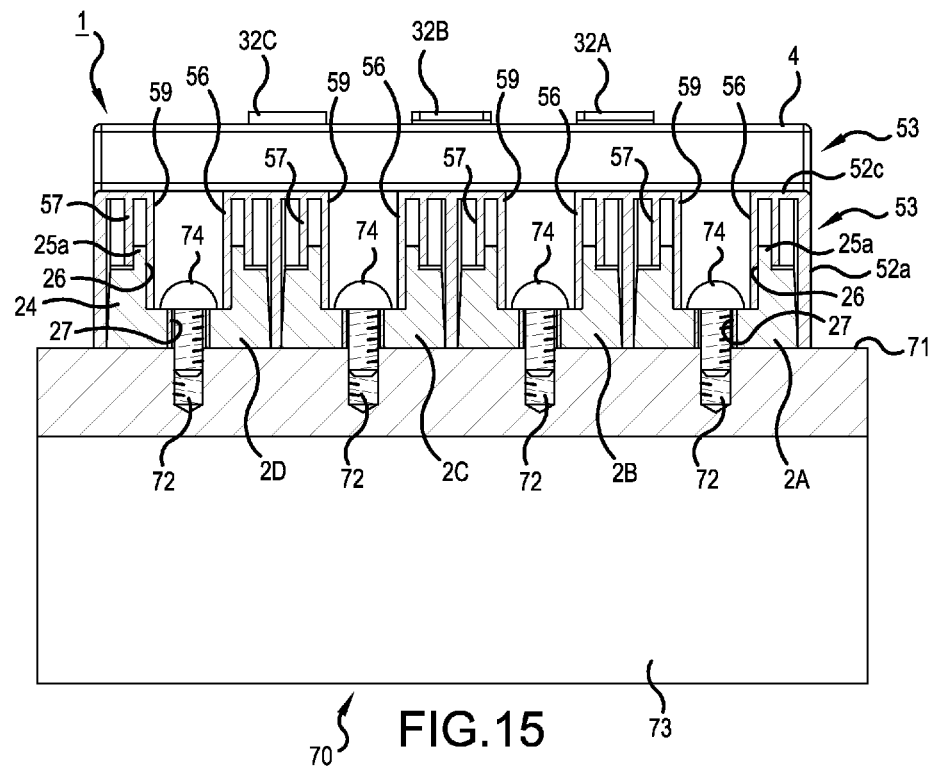
FIG. 15 is a cross-sectional view illustrating the state in which the semiconductor devices are connected to the cooler.

The cooler 70 is made of a metal material with high thermal conductivity, such as aluminum, an aluminum alloy, or copper. As illustrated in FIG. 15, the cooler 70 has a mounting surface 71 on which the semiconductor device 1 is mounted as its upper surface. Female screw portions 72 are formed in the mounting surface at positions facing the attachment holes 27 of the power semiconductor modules 2A to 2D of the semiconductor device 1. In addition, cooling fins 73, which extend to the lower side, are formed on the rear surface side of the cooler 70 at predetermined intervals.

As illustrated in FIG. 15, the semiconductor device 1 is mounted and fixed to the mounting surface 71 of the cooler 70. The semiconductor device 1 is fixed by inserting the attachment screws 74 as the fixing tools into the attachment insertion holes 59 of the module storage case 4 and the attachment holes 27 of the power semiconductor modules 2A to 2D to screw the male screw portion to the female screw portion 72 formed in the mounting surface 71 of the cooler 70.

In this case, the power semiconductor modules 2A to 2D are respectively accommodated in the individual storage regions 54A to 54D in the module storage region 52 of the module storage case 4 with flexibility in attachment such that the position of the power semiconductor modules 2A to 2D can be adjusted during attachment. The power semiconductor modules 2A to 2D are directly fixed to the mounting surface 71 of the cooler 70 by the attachment screws 74. Therefore, the copper blocks 23A and 23B of the power semiconductor module 2A to 2D, which are exposed from the opening portion 51 of the module storage case 4, reliably come into close contact with the mounting surface 71 of the cooler 70 and are fixed thereto.

In addition, the connection pieces 34 of the main terminal plates 3A, 3B, and 3C to which the pin-shaped conductive bodies 18, 20, and 19 of the power semiconductor modules 2A to 2D are connected have flexibility in the up-down direction of the power semiconductor modules 2A to 2D. Therefore, it is possible to ensure flexibility in the attachment of the power semiconductor modules 2A to 2D in the up-down direction. When the bending plate portions 32A to 32C of the main terminal plates 3A to 3C are bent, a gap is provided between the bottom of each bending plate portion and the upper surface plate 61a of the main terminal plate storage region 53 of the module storage case 4. Therefore, it is possible to ensure flexibility in the attachment of the power semiconductor modules 2A to 2D in the up-down direction.

Therefore, the copper blocks 23A and 23B of the power semiconductor modules 2A to 2D can reliably come into close contact with the mounting surface 71 of the cooler 70. As a result, it is possible to reliably dissipate heat generated from the semiconductor chips 12A and 12B, which are heating bodies of each of the power semiconductor modules 2A to 2D, to the cooler 70 through the copper blocks 16A and 16B, the conductor patterns of the insulating substrates 11A and 11B, and the copper blocks 23A and 23B and to prevent the overheating of the semiconductor chips 12A and 12B.

In this case, the module storage case 4 is not directly fixed to the cooler 70. The module storage case 4 is indirectly fixed to the cooler 70 and is not separated from the cooler 70. That is, each of the power semiconductor modules 2A to 2D is snap-fitted to the module storage case 4. Therefore, when the power semiconductor modules 2A to 2D are fixed to the cooler 70, the module storage case 4 is also fixed. In addition, the bending plate portions 32A, 32B, and 32C of the main terminal plates 3A, 3B, and 3C which are soldered to the pin-shaped conductive bodies 18, 20, and 19 of the power semiconductor modules 2A to 2D protrude upward from the module storage case 4 through the insertion holes 69a, 69b, and 69c, are bent, and serve as the main terminal segments. In this way, the detachment of the module storage case 4 is also prevented.

When the power semiconductor modules 2A to 2D are fixed to the cooler 70, the attachment screws 74 are inserted into the attachment holes 27, which are provided at both ends of each of the power semiconductor modules 2A to 2D in the longitudinal direction, and are then fixed. The attachment hole 27 is surrounded by the concave portion 26 and the U-shaped protruding portion 25c. In addition, the cylindrical portion 56 formed in the module storage case 4 is fitted to the concave portion 26 and the U-shaped protruding portion 57 is fitted to the outer circumferential side of the U-shaped protruding portion 25c. Therefore, it is possible to ensure the insulation of the attachment screws 74 from the pin-shaped conductive bodies 18 and 19 and the main terminal plates 3A and 3C.

As described above, according to the above-described embodiment, the plurality of power semiconductor modules 2A to 2D can be integrated into the module aggregate 40. Therefore, once one type of power semiconductor module with basic capacity is manufactured, the power semiconductor modules can be combined with each other to develop a module with various capacities. As a result, it is not necessary to manufacture an individual module for each capacity, unlike the related art, and it is possible to improve production efficiency.

The plurality of power semiconductor modules 2A to 2D are respectively held in the individual storage regions 54A to 54D in the module storage region 52 of the module storage case 4 with a predetermined flexibility in attachment such that the position of the power semiconductor modules 2A to 2D can be adjusted during attachment. In addition, the semiconductor device 1 is attached to the cooler 70 using the attachment holes of the individual power semiconductor modules 2A to 2D. Therefore, the cooling surfaces of the copper blocks 23A and 23B on the rear surface of the insulating substrate which are exposed from each of the power semiconductor modules 2A to 2D is aligned with the mounting surface 71 of the cooler 70 by the deformation of the components of the module aggregate 40 and the module aggregate 40 is in the same state as that when small modules are individually attached. That is, even when the current capacity of the semiconductor circuit increases and the size of the module aggregate 40 mounted on the cooler 70 increases, the same cooling performance as that of a small module is obtained and good characteristics are expected in terms of reliability.

In the semiconductor device according to the related art, as the size of the module increases with an increase in capacity, the flatness of the attachment surface of the heat dissipation base plate having the insulating substrate bonded thereto is reduced. As a result, a thermal compound needs to be thickly applied onto the attachment surface in order to ensure thermal connection to the cooler. In this case, thermal resistance increases and the thermal deformation of the power semiconductor module (including a radiator) during an operation increases. Therefore, it is difficult to improve the adhesion between the cooling surface (base plate) and the fins and to ensure heat dissipation efficiency.

However, in this embodiment, as described above, the cooling surfaces of the copper blocks 23A and 23B of the plurality of power semiconductor modules 2A to 2D, which are accommodated in the module storage case 4 individually, come into close contact with the mounting surface 71 of the cooler 70. Therefore, it is possible to improve the cooling performance, without applying the thermal compound with a large thickness. A wide band gap element, such as SiC, which has drawn attention in recent years has high efficiency, but it is difficult to make the wide band gap element as large as a Si element in terms of yield due to a crystal defect in the substrate. In order to increase capacity, a plurality of chips are connected in parallel to each other and are then used. In some cases, for the Si element, a structure in which a plurality of small chips that are mass-produced are connected in parallel to each other and are then used has an advantage over a structure in which a large chip with a high rating is used in manufacturing costs. The structure according to embodiments of the invention is more effective in this case.

For example, the relational expression between the probability $\alpha$ of an assembly failure per semiconductor chip and a module assembly yield $\beta$ is represented by $\beta=(1-\alpha)^n$ (where n is the number of chips mounted). The relationship between the assembly failure rate $\alpha$ per semiconductor chip and the module assembly yield $\beta$ is represented as illustrated in FIG. 16, using the numbers of chips, 10, 20, 40, and 80, as parameters.

Figure 16:
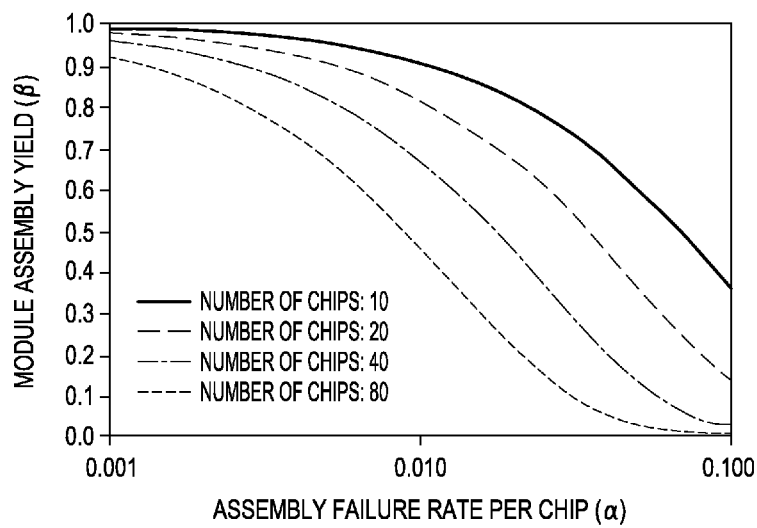
FIG. 16 is a conceptual diagram illustrating yield for each number of chips mounted in the semiconductor device.

As can be seen from FIG. 16, when the assembly failure rate per semiconductor chip in the entire assembly process is 0.1%, the module assembly yield $\beta$ is equal to or greater than 90%, regardless of the number of chips mounted. In the case in which the assembly failure rate per semiconductor chip is 1%, when the number of semiconductor chips is 80, the module assembly yield $\beta$ is reduced to 50%. In contrast, when the number of semiconductor chips is 10, the module assembly yield $\beta$ is maintained at 90%.

Therefore, as in this embodiment, a method for minimizing the number of semiconductor chips in the power semiconductor module and combining a plurality of good power semiconductor modules to improve high capacity is advantageous in terms of costs. That is, when there are a large number of semiconductor chips in the power semiconductor module and some of the semiconductor chips are defective, the power semiconductor module is also defective. Therefore, as the number of semiconductor chips in the power semiconductor module increases, the yield is reduced.

In the above-described embodiment, the module aggregate 40 is accommodated in the module storage case 4 and the bending plate portions 32A to 32C of the main terminal plates 3A to 3C are bent. In this state, the power semiconductor modules 2A to 2D are fixed to the cooler 70. However, the invention is not limited to the above-mentioned attachment order. When the semiconductor device 1 is fixed to the cooler 70, the power semiconductor modules 2A to 2D may be fixed to the cooler 70, without bending the bending plate portions 32A to 32C of the main terminal plates 3A to 3C, and then the bending plate portions 32A to 32C may be bent.

In the above-described embodiment, the guide protrusions 55 which define the individual storage regions 54A to 54D in the module storage region 52 of the module storage case 4 each include the T-shaped partition wall 55c which has the protruding fitting portion 55b at its leading end. However, the invention is not limited to the above-mentioned structure, but the leading end of the T-shaped partition wall 55c may have any shape, such as a triangular shape or a semicircular shape. That is, the T-shaped partition wall 55c may have any shape as long as it can be fitted to the fitting groove 28 of each of the power semiconductor modules 2A to 2D, guide the power semiconductor module, and prevent the detachment of the power semiconductor module to the outside in the front-rear direction. Similarly, the fitting groove 28 in each of the power semiconductor modules 2A to 2D may have any cross-sectional shape.

In the above-described embodiment, four power semiconductor modules 2A to 2D are densely accommodated in the module storage case 4. However, the invention is not limited thereto. For example, the maximum number of power semiconductor modules mounted or the mounting interval of the power semiconductor modules is appropriately determined for each product. In addition, the power semiconductor modules whose number is less than the maximum number of power semiconductor modules mounted may be accommodated so as to be arranged at intervals of an arbitrary number of power semiconductor modules (thinned out). When a space is provided between the power semiconductor modules, the size of the module aggregate increases. However, since heat generating portions are dispersed, it is possible to improve a heat dissipation effect.

In the above-described embodiment, the pin-shaped conductive bodies 21a, 21b, 22a, and 22b of each of the power semiconductor modules 2A to 2D are connected to the external connection terminals 43a, 43b, 44a, and 44b through the conductive pattern formed on the printed circuit board 41, respectively. However, the invention is not limited to the above-mentioned structure. The pin-shaped conductive bodies 21a, 21b, 22a, and 22b of each of the power semiconductor modules 2A to 2D may individually protrude from the module storage case 4. In addition, the pin-shaped conductive bodies 21a, 21b, 22a, and 22b of each of the power semiconductor modules 2A to 2D may be connected by, for example, connection lines or other terminal plate, instead of the printed circuit board 41.

Figure 17:
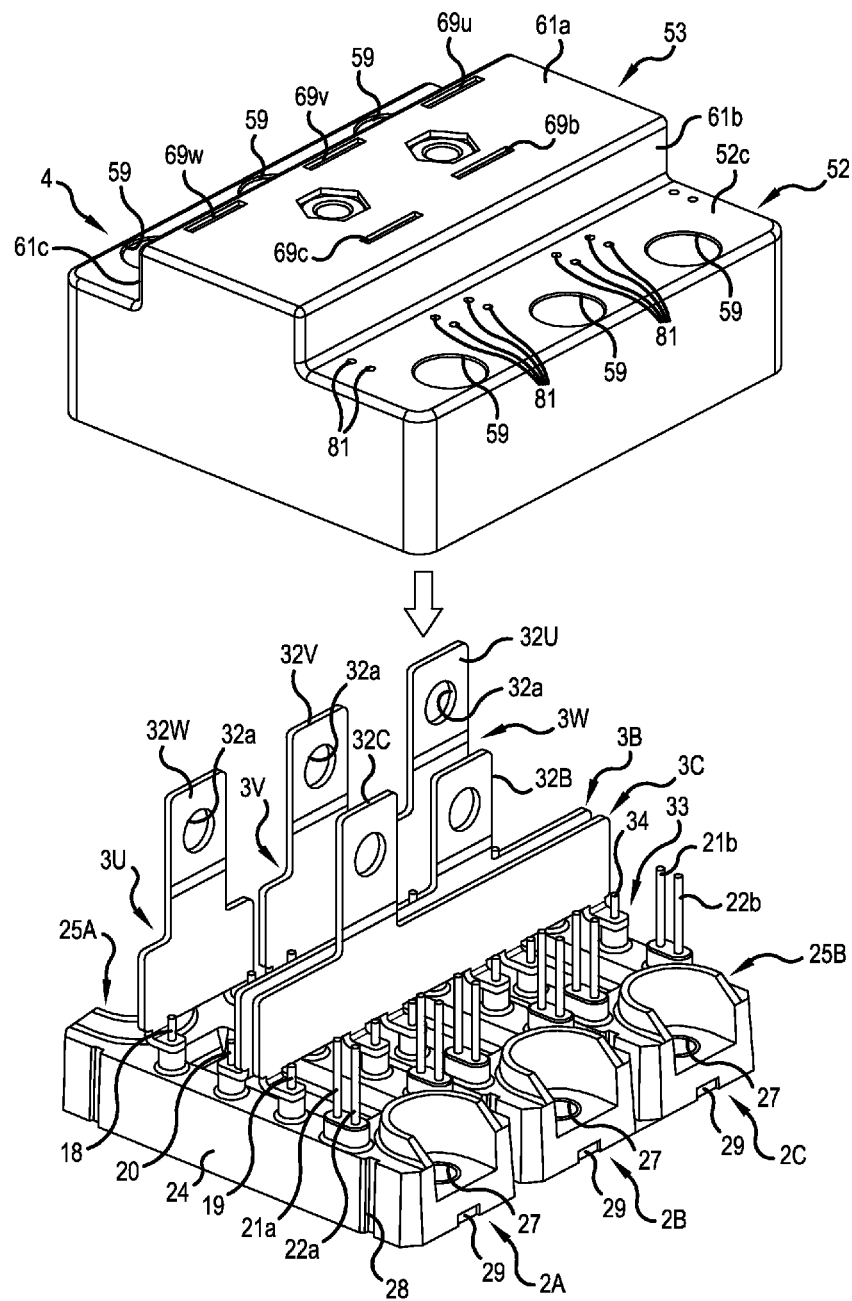
FIG. 17 is an exploded perspective view illustrating a semiconductor device according to another embodiment of the invention.

In the above-described embodiment, a plurality of power semiconductor modules are accommodated in the module storage case 4 to form one phase of the inverter device. However, the invention is not limited to the above-mentioned structure. As illustrated in FIG. 17, three power semiconductor modules 2A to 2C may be used and individual main terminal plates 3U, 3V, and 3W may be fixed to the pin-shaped conductive bodies 19 of each of the power semiconductor modules 2A to 2C by a fixing means, such as soldering, welding, or brazing. In correspondence with this structure, as illustrated in FIG. 17, insertion holes 69$u$, 69$v$, and 69$w$ into which the main terminal plates 3U, 3V, and 3W are respectively inserted may be formed in the module storage case 4 and bending plate portions 32U, 32V, and 32W may pass through the insertion holes 69$u$, 69$v$ and 69$w$ to form a three-phase inverter device. In addition, the printed circuit board 41 is omitted. The pin-shaped conductive bodies 21$a$, 21$b$, 22$a$, and 22$b$ of each of the power semiconductor modules 2A to 2C are lengthened, instead of using the printed circuit board 41, and directly protrude upward from the module storage case 4 via through holes 81 which are formed in the upper surface plate 52$c$ of the module storage case 4.

Figure 10:
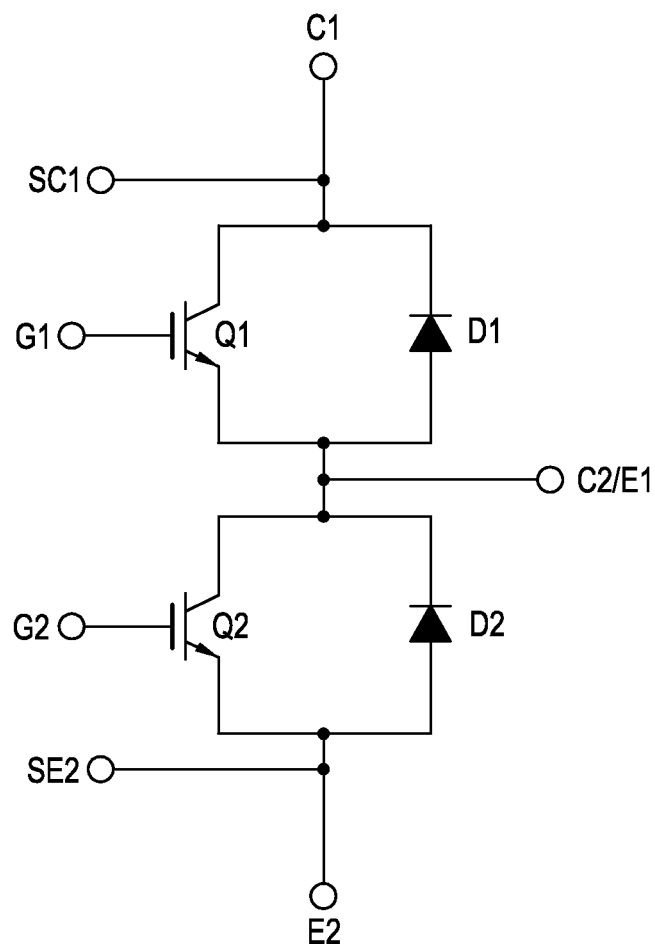
FIG. 10 is a circuit diagram illustrating an equivalent circuit of the power semiconductor module.
Figure 18:
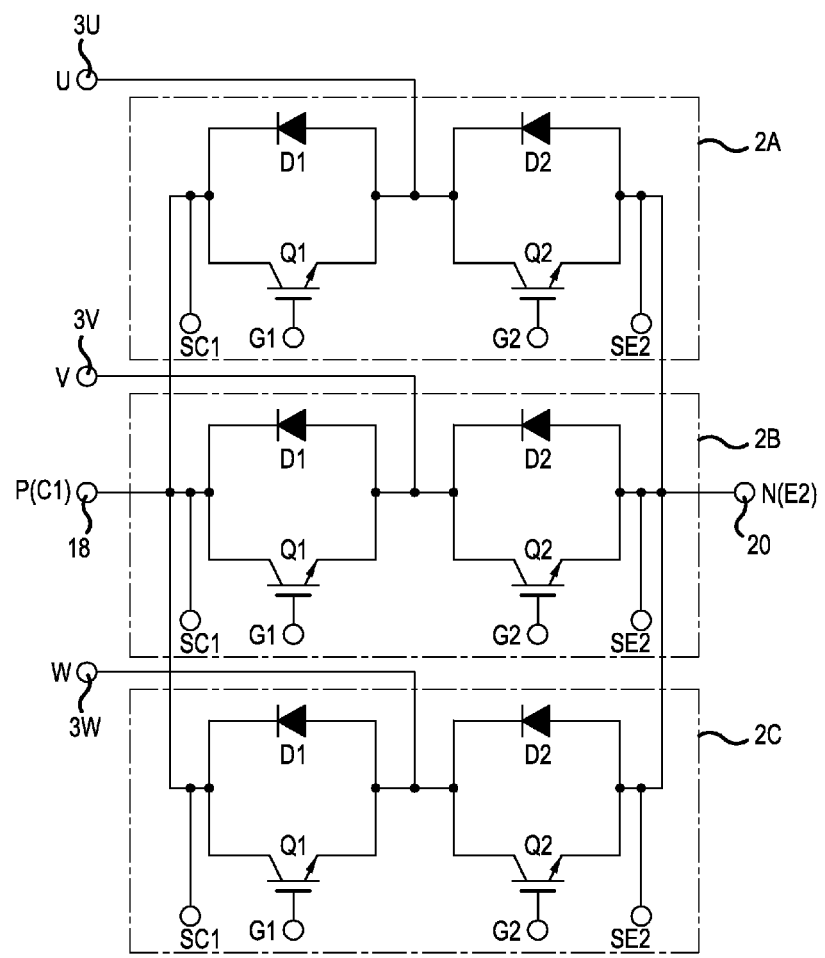
FIG. 18 is a circuit diagram illustrating an equivalent circuit of FIG. 17.

In this case, an equivalent circuit structure is as illustrated in FIG. 18 in which the equivalent circuit structures illustrated in FIG. 10 are connected in parallel to each other. For example, the power semiconductor module 2A forms a U-phase arm, the power semiconductor module 2B forms a V-phase arm, and the power semiconductor module 2C forms a W-phase arm. The main terminal plates 3U, 3V, and 3W of the power semiconductor modules 2A, 2B, and 2C are drawn as a U-phase output terminal U, a V-phase output terminal V, and a W-phase output terminal W, respectively. In addition, gate terminals G1 and G2, which are respectively connected to the pin-shaped conductive bodies 21$a$ and 21$b$ of each of the power semiconductor modules 2A to 2C, are individually drawn and a sense collector terminal SC1 and a sense emitter terminal SE2, which are respectively connected to the pin-shaped conductive bodies 22$a$ and 22$b$, are individually drawn.

According to the above-described embodiment, it is possible to seriate power semiconductor modules prepared for each current capacity. That is, when a plurality of power semiconductor modules are accommodated in the module storage case and are connected in parallel to each other, it is possible to change the number of parallel connections to easily change the current capacity. Therefore, it is possible to easily change current capacity, without an increase in costs unlike the case in which packages prepared for each current capacity are seriated. In addition, when a common module storage case is used, it is possible to standardize an outward appearance or a terminal position.

According to the above-described embodiment, a plurality of chips are not mounted in one package, but unit power semiconductor modules are combined with each other, in order to increase capacity. Therefore, it is possible to reduce the number of semiconductor chips mounted in the unit power semiconductor module. As a result, even when a defect is detected from the semiconductor chip after the semiconductor chip is mounted and the power semiconductor module is determined to be defective, it is possible to reduce the number of normal semiconductor chips incorporated into the defective power semiconductor module. Therefore, yield is not reduced.

According to the above-described embodiment, a plurality of power semiconductor modules, each having the semiconductor chips provided therein, are accommodated in the module storage case with a predetermined flexibility in attachment such that the attachment position of the power semiconductor modules can be adjusted, with the power semiconductor modules being connected by the main terminal plates. Therefore, it is possible to treat a plurality of power semiconductor modules as one power semiconductor module and to reliably contact each power semiconductor module with the cooler. For example, in a large power semiconductor module in which all semiconductor elements forming the circuit illustrated in FIG. 13 or FIG. 18 are mounted on one radiation base plate, the flatness of the radiation base plate is reduced. As a result, adhesion to an external radiation fin is reduced and the cooling performance deteriorates. In contrast, in the above-described embodiment, since each of the power semiconductor modules accommodated in the module storage case is fixed to the cooler, it is possible to reliably contact each power semiconductor module with the cooler.

According to the above-described embodiment, the main terminal plates 3A to 3C and the power semiconductor modules 2A to 2D are positioned by bringing the bottom of each connection piece 34 into contact with the upper surface of the insulating base 24$b$. However, the invention is not limited to the above-mentioned structure. For example, when the main terminal plates 3A to 3C are configured such that one end of the terminal plate body 31 is bent to form a continuous connection piece 34 as illustrated in FIG. 19, the positioning portion can be changed as illustrated in FIG. 20.

Figure 20:
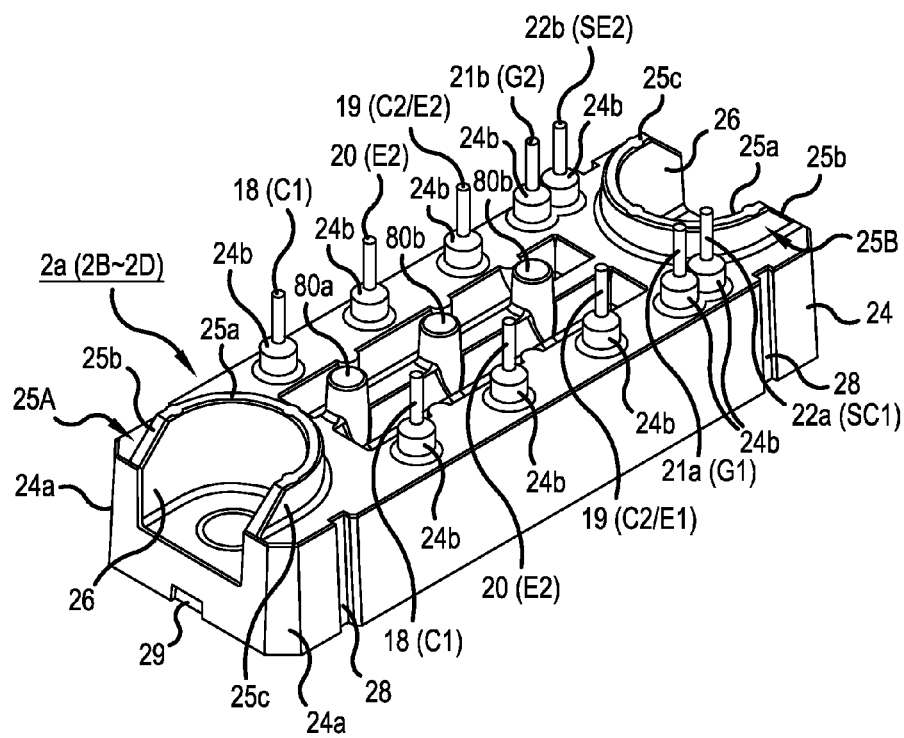
FIG. 20 is a perspective view illustrating a modification of the power semiconductor module.
Figure 21:
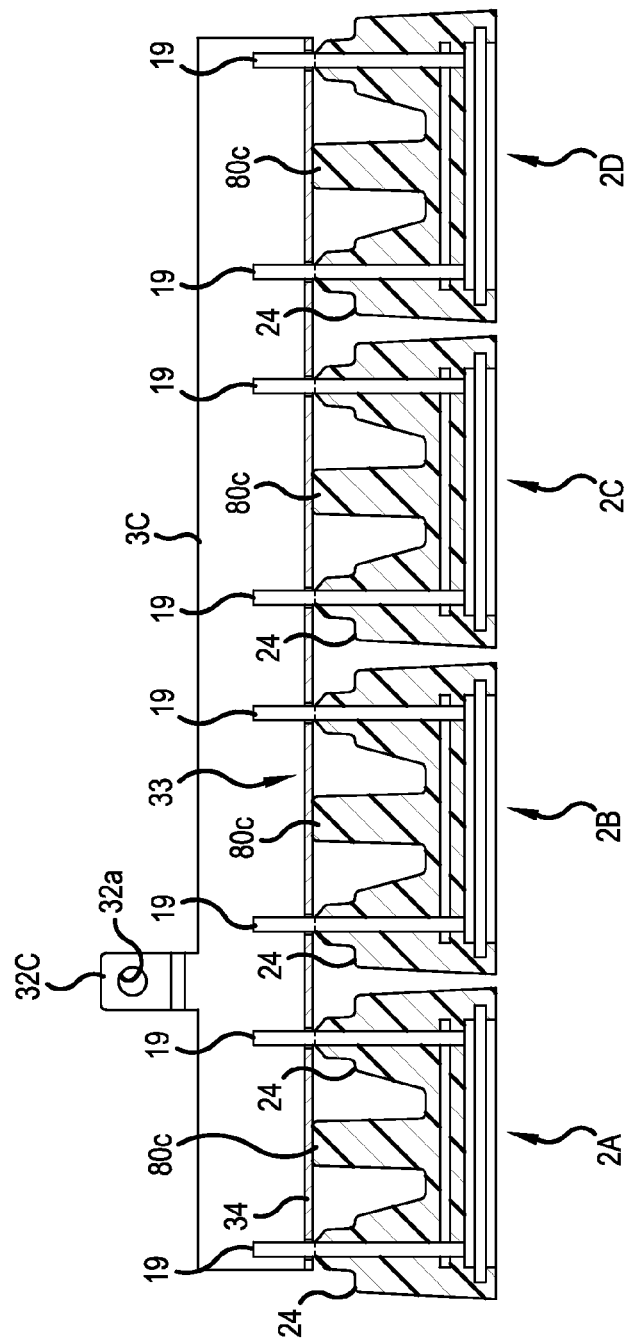
FIG. 21 is a cross-sectional view illustrating a state in which a main terminal plate is connected to a plurality of power semiconductor modules illustrated in FIG. 20.

That is, in FIG. 20, positioning bases 80$a$, 80$b$, and 80$c$, each having the flat upper surface, are formed between pairs of pin-shaped conductive bodies 18, 20, and 19 serving as the main terminals so as to protrude from the upper surface of the molded body 24. In this case, as illustrated in FIG. 21, it is possible to perform positioning by bringing the bottoms of the connection pieces 34 into contact with the upper surfaces of the positioning bases 80$a$, 80$b$, and 80$c$, with the pin-shaped conductive bodies 18, 20, and 19 being inserted into insertion holes 34$a$ which are formed in the connection pieces 34 of the main terminal plates 3A, 3B, and 3C. As such, when the positioning bases 80$a$ to 80$c$ are formed, it is not necessary to form positioning flat portions in the upper surfaces of the insulating bases 24$b$ for the pin-shaped conductive bodies 18, 20, and 19 from which the pin-shaped conductive bodies 18, 20, and 19 protrude. Therefore, it is not necessary to mold the insulating base 24$b$ with high accuracy and it is possible to improve ease of molding of the molded body 24.

According to the above-described embodiment, the attachment holes 27 are formed at both ends of each of the power semiconductor modules 2A to 2D in the longitudinal direction. However, the invention is not limited thereto. The attachment holes may be formed at any position and an arbitrary number of attachment holes may be formed. In this case, the position of the attachment insertion holes 59 in the module storage case 4 and the number of attachment insertion holes 59 may be changed depending on the position of the attachment holes and the number of attachment holes.

In the invention, a desired circuit structure is obtained only by a combination of the terminal connections of the power semiconductor modules. The invention is not limited to the above-mentioned inverter device for power conversion, but can be applied to other power conversion devices using the power semiconductor module or other semiconductor devices, such as radio-frequency switching ICs.

According to the invention, a plurality of semiconductor modules, each having the semiconductor chips provided therein, are accommodated and held in the module storage case such that the position of the semiconductor modules can be adjusted during attachment, with the semiconductor modules being connected by the main terminal plates. Therefore, it is possible to provide a semiconductor device which can ensure the reliable contact between a plurality of semiconductor modules and an attachment body and facilitate an attachment operation.

The invention claimed is:

1. A semiconductor device comprising:
a plurality of semiconductor modules, each of the plurality of semiconductor modules comprising a circuit board having at least one or more semiconductor chips mounted thereon, an attachment hole, a heat dissipation portion exposed at one end portion of the attachment hole, and a protruding connection terminal;
main terminal plates that connect connection terminals of the plurality of semiconductor modules and form an electrical conduction path connecting semiconductor circuits in the semiconductor module; and
a module storage case accommodating the plurality of semiconductor modules such that positions of the semiconductor modules are adjustable and comprising insertion holes, through which a portion of each of the main terminal plates is drawn as a main terminal segment, and attachment insertion holes facing the attachment holes of the semiconductor modules,
wherein the attachment holes of the semiconductor modules penetrate an entire thickness of the semiconductor modules.

2. The semiconductor device according to claim 1, wherein:
the plurality of semiconductor modules are individually accommodated in parallel in a module storage region of the module storage case, and the main terminal plates are accommodated in a terminal plate storage region connected to the module storage region, and
the module storage region comprises guide protrusions that guide the side surfaces of the semiconductor modules and define individual storage regions for accommodating the plurality of semiconductor modules.

3. The semiconductor device according to claim 2, wherein a width of the module storage region is configured such that the module storage region accommodates and holds the semiconductor modules with a gap between immediately adjacent semiconductor modules.

4. The semiconductor device according to claim 2,
wherein the guide protrusion comprises, at its leading end, a fitting convex portion that is fitted to a fitting groove disposed in the side surface of the semiconductor module.

5. The semiconductor device according to claim 2,
wherein the module storage case is flexible, and
a snap-fitting protrusion disposed in the module storage region is fitted to a snap-fitting concave portion disposed in the semiconductor module.

6. The semiconductor device according to claim 2,
further comprising an insulating partition wall insulating the main terminal plates and disposed in the terminal plate storage region.

7. The semiconductor device according to claim 2,
wherein the module storage case accommodates the plurality of semiconductor modules, with the heat dissipation portion exposed outside the module storage case, and
fixing tools are disposed in the attachment holes of the semiconductor modules through the attachment insertion holes, with the heat dissipation portion contacted with a cooler, to fix each of the accommodated plurality of semiconductor modules to the cooler.

8. The semiconductor device according to claim 2,
wherein, in the module storage case, the attachment insertion hole is formed in an inner circumferential surface of a cylindrical portion that is fitted to the attachment hole of the semiconductor module.

9. The semiconductor device according to claim 2,
wherein the main terminal plate comprises:
a terminal plate body extending so as to traverse the plurality of semiconductor modules and having a plate surface parallel to the attachment hole;
a bending plate portion provided on one of end surfaces perpendicular to the longitudinal direction of the terminal plate body and serving as the main terminal segment; and
a connection terminal holding portion disposed at the other end surface so as to protrude therefrom and comprising insertion holes into which the connection terminals of the plurality of semiconductor modules are inserted.

10. The semiconductor device according to claim 9,
wherein the connection terminal holding portion comprises a plurality of flexible connection pieces formed as protrusions at positions corresponding to the connection terminals of the plurality of semiconductor modules.

11. The semiconductor device according to claim 9,
wherein the bending plate portion protrudes from the module storage case and is bent so as to face a nut stored in a nut storage concave portion disposed in an outer surface of the terminal plate storage region to form the main terminal segment, and
the bending plate portion comprises an insertion hole facing a female screw of the nut and having a larger inside diameter than that of the female screw.

12. The semiconductor device according to claim 1,
wherein the attachment holes of the semiconductor modules and the attachment insertion holes of the module storage case face each other in a one-to-one correspondence.

13. The semiconductor device according to claim 1,
wherein each of the plurality of semiconductor modules comprises a first attachment hole and a second attachment hole, and the module storage case comprises first attachment insertion holes respectively facing the first attachment holes and second attachment insertion holes respectively facing the second attachment holes.

14. A method for manufacturing a semiconductor device in which a plurality of semiconductor modules, each of the plurality of semiconductor modules comprising a circuit board having at least one or more semiconductor chips mounted thereon and an attachment hole, are arranged and held in a module storage case, the method comprising:
inserting a main connection terminal protruding from each of the plurality of semiconductor modules into an insertion hole of a connection terminal holding portion formed in a main terminal plate traversing the plurality of semiconductor modules, with the plurality of semiconductor modules arranged in parallel, and fixing the main connection terminal and the connection terminal holding portion to form a module aggregate;
accommodating and holding the module aggregate in the module storage case such that a bending plate portion of the main terminal plate protrudes toward the outside through an attachment insertion hole of the module storage case, the position of the semiconductor modules being adjustable during attachment, thereby forming a semiconductor device; and
mounting the module storage case on a cooler and inserting fixing tools into the attachment holes of the plurality of semiconductor modules through insertion holes disposed in the module storage case, thereby fixing each of the accommodated plurality of semiconductor modules to the cooler.

15. The method for manufacturing a semiconductor device according to claim 14, wherein the bending plate portion of the main terminal plate is bent to cover a nut that is inserted into a nut insertion concave portion disposed in an outer surface of a main terminal plate storage region of the module storage case when the semiconductor device is formed or after the semiconductor device is mounted on the cooler.

* * * * *